US012791634B2

(12) United States Patent
Ghezzi et al.

(10) Patent No.: US 12,791,634 B2
(45) Date of Patent: Nov. 10, 2026

(54) METHOD AND DEVICE FOR DETERMINING A DIGITAL VALUE INDICATIVE OF A PHYSICAL QUANTITY TO BE MEASURED

(71) Applicant: Melexis Technologies SA, Bevaix (CH)

(72) Inventors: Cesare Ghezzi, Bevaix (CH); Lionel Tombez, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 170 days.

(21) Appl. No.: 18/779,342

(22) Filed: Jul. 22, 2024

(65) Prior Publication Data

US 2025/0035716 A1 Jan. 30, 2025

(30) Foreign Application Priority Data

Jul. 25, 2023 (EP) .................................... 23187677

(51) Int. Cl.
*G01R 33/00* (2006.01)
*G01R 17/10* (2006.01)

(52) U.S. Cl.
CPC ......... *G01R 33/0023* (2013.01); *G01R 17/10* (2013.01)

(58) Field of Classification Search
CPC .. G01R 33/00; G01R 33/0023; G01R 33/007; G01R 33/0082; G01R 33/02; G01R 33/06; G01R 33/07; G01R 17/00; G01R 17/10; G01R 19/00; G01R 19/25; G01R 19/2506; G01R 33/09; G01R 17/105; G01R 19/2509; H03M 1/00; H03M 1/12; H03M 1/50; H03M 1/56
USPC ......................................... 324/200, 244, 251
See application file for complete search history.

(56) References Cited

U.S. PATENT DOCUMENTS

| | | | |
|---|---|---|---|
| 10,698,009 | B2 | 6/2020 | Raman et al. |
| 2009/0015240 | A1 | 1/2009 | Kobayashi |

FOREIGN PATENT DOCUMENTS

| | | | | | |
|---|---|---|---|---|---|
| CN | 104808064 | A | | 7/2015 | |
| CN | 108398142 | A | | 8/2018 | |
| CN | 118688479 | A | * | 9/2024 | ............. G01R 23/10 |
| EP | 3358309 | B1 | | 4/2019 | |
| TW | 201321778 | A | * | 6/2013 | ........... G01R 29/027 |

OTHER PUBLICATIONS

Extended European Search Report from corresponding EP Application No. 23187677.2, Jan. 25, 2024.

(Continued)

*Primary Examiner* — Hoai-An D. Nguyen
(74) *Attorney, Agent, or Firm* — Workman Nydegger

(57) ABSTRACT

A method of providing a digital value indicative of a physical quantity to be measured by a sensor circuit or a bridge circuit that has two excitation nodes and at least one output node, including the steps of: a) applying a time-varying biasing signal to the excitation nodes, causing at least one output-node to provide a time-varying output signal; b) determining a first time value or a first count value or a first index related to a first event at which the first output signal passes a first threshold signal; c) providing a digital value indicative of the physical quantity to be measured based on the at least one time value or count value or index value.

14 Claims, 17 Drawing Sheets

(56) References Cited

OTHER PUBLICATIONS

Ganesan, Harikumar et al., "A Dual Slope LVDT-to-Digital Converter", IEEE Sensors Journal, vol. 19, No. 3, Feb. 1, 2019, pp. 868-876.

Extended European Search Report from Related European Patent Application No. EP24187708.3, Dec. 13, 2024.

* cited by examiner

1100

1200

METHOD AND DEVICE FOR DETERMINING A DIGITAL VALUE INDICATIVE OF A PHYSICAL QUANTITY TO BE MEASURED

FIELD OF THE INVENTION

The present invention relates in general to the field of digitization methods and circuits, and more in particular to methods and circuits for digitizing a differential output of a sensor circuit or a bridge circuit that has two excitation nodes (also referred to as "input nodes") and two readout nodes (also referred to as "output nodes"). The present invention also relates to integrated circuits comprising such a sensor or bridge and digitization circuit.

BACKGROUND OF THE INVENTION

FIG. 1 is a schematic representation of a horizontal Hall element having two excitation nodes E1, E2 (or "input nodes") and two readout nodes RO1, RO2 (or "output nodes"). When a constant voltage (typically referred to as "biasing voltage") is applied over the input nodes, a current will flow through the Hall element. In the absence of a magnetic field, the voltages v1, v2 of the output nodes are equal, and thus a differential voltage Vdiff over these nodes will be equal to zero. In the presence of a magnetic field oriented perpendicular to the Hall element, the voltage levels at the output nodes will be different, and a differential voltage Vdiff will occur over the output nodes RO1, RO2.

FIG. 2A is a schematic representation of a Wheatstone bridge comprising four resistors R1, R2, R3, R4, e.g. magnetoresistive elements or piezoresistive elements. The bridge has two parallel branches, each comprising two resistors in series. The bridge has two excitation nodes (or "input nodes") E1, E2, and two readout nodes (or "output nodes") RO1, RO2. When the four resistor values R1 to R4 are equal, the bridge is in balance, and the output voltages v1, v2 are equal, hence, a differential voltage Vdiff over the output nodes is zero. When one of the resistor values changes, the bridge is no longer balanced, and a voltage difference Vdiff will occur over the output nodes.

FIG. 3 shows a classical circuit for sensing and digitizing a differential voltage signal Vdiff, such as e.g. the differential output voltage obtained from the Hall element of FIG. 1, or the differential output voltage obtained from the Wheatstone bridge of FIG. 2A. The sensing and digitizing circuit comprises a differential amplifier, followed by a classical analog-to-digital convertor (ADC). The ADC provides a digital value Dig_Value corresponding to the differential voltage Vdiff, indicative of the physical value to be measured (e.g. a magnetic field component in case Vdiff comes from a horizontal Hall element, or e.g. a pressure value in case Vdiff comes from a Wheatstone-bridge with piezo-resistive elements, etc.)

Many different types of ADC are available, having different characteristics in terms of conversion speed, power consumption, accuracy, footprint (e.g. Si area), etc.

There is always room for improvements or alternatives.

SUMMARY OF THE INVENTION

It is an object of embodiments of the present invention to provide methods and circuits for providing a digital value indicative of a physical quantity to be measured by a sensor circuit or a bridge circuit that has two excitation nodes (or "input nodes") and at least one readout node (or "output node"), e.g. two output nodes, or three output nodes.

It is also an object of embodiments of the present invention to provide an integrated circuit comprising such a sensor circuit or bridge circuit and such an evaluation or processing circuit.

It is an object of particular embodiments of the present invention to provide such an integrated sensor device with error detection capabilities.

These and other objectives are accomplished by embodiments of the present invention.

According to a first aspect, the present invention provides a method of providing a digital value (e.g. Dout) indicative of a physical quantity to be measured by a sensor or a bridge circuit that has two excitation nodes (e.g. E1, E2) and at least one output node (e.g. RO1, RO2), e.g. two readout nodes, the method comprising the steps of: a) applying a time-varying biasing signal (e.g. Vbias) e.g. a biasing voltage or a biasing current to the excitation nodes (e.g. E1, E2), causing the at least one output node (e.g. RO1, RO2) to provide at least one time-varying output signal (e.g. Vp, Vn), e.g. an output voltage or an output current; c) determining at least one time value (e.g. T1) or at least one count value (e.g. N1) or at least one index value (e.g. index1) related to a first event (e.g. event1) at which the at least one readout signal (e.g. Vp) passes at least one threshold signal (e.g. Vt); d) determining a digital value (e.g. Dout) indicative of the physical quantity to be measured based on said at least one time value (e.g. T1) or said at least one count value (e.g. N1) or said at least one index value (e.g. index1).

Methods according to the first aspect may also be formulated as follows: a method of providing a digital value (e.g. Dout) indicative of a physical quantity to be measured by a sensor circuit or a bridge circuit that has two excitation nodes (e.g. E1, E2) and at least one output node (e.g. RO1, RO2), e.g. two readout nodes, the method comprising the steps of: a) applying a time-varying biasing signal (e.g. Vbias) e.g. a biasing voltage or a biasing current, e.g. having a predefined or a configurable waveform, to the excitation nodes (e.g. E1, E2), causing the at least one output node (e.g. RO1, RO2) to provide at least one time-varying output signal (e.g. Vp, Vn), e.g. an output voltage or an output current; b) using (e.g. considering and/or generating) at least one threshold signal (Vt) having a predefined value or a configurable value or a predefined or a configurable waveform; c) determining at least one time value (e.g. T1) or at least one count value (e.g. N1) or at least one index value (e.g. index1) related to a first event (e.g. event1) at which the at least one readout signal (e.g. Vp) passes the at least one threshold signal (e.g. Vt); d) determining a digital value (e.g. Dout) indicative of the physical quantity to be measured based on said at least one time value (e.g. T1) or said at least one count value (e.g. N1) or said at least one index value (e.g. index1).

Step d) may take into account, explicitly or implicitly, the waveform of the biasing signal and/or the value of or the waveform of the threshold signal, e.g. by means of a first and/or second reference number and/or by means of one or more parameters.

Step d) may comprise: using a predefined lookup table, or using one or more predefined mathematical formula. If, for example, only one predefined (i.e. known) biasing waveform can be applied in step a), and if only one threshold value or threshold signal can be applied in step b), (e.g. repeatedly the same threshold value), then there is a 1-to-1 relation between the digital value and T1, or between the digital value and N1, or between the digital value and Index1, and specifics of the waveform of the biasing signal and/or the threshold signal are not required in step d). Indeed, they may be taken into account in the values of the look-up table, or in parameter-values or coefficients of the predefined mathematical function(s).

However, if one out of at least two different biasing waveforms can be applied in step a), and/or if one out of at least two threshold values or threshold signals can be applied in step b), then step d) may need to know which of these biasing waveforms and/or which of these threshold values or signals was actually used, but again, the characteristics of the waveform itself, or the threshold value itself is not required, and one or more reference(s), e.g. one ore more digital number indicating which of the predefined biasing waveforms and/or threshold values or threshold waveforms was used, is sufficient.

The predefined lookup-table may be a predefined table determined during design or during simulation, or can be measured during calibration, and stored in a non-volatile memory, e.g. of the sensor device that contains said sensor circuit, and preferably also the circuit that generates the biasing waveform and the threshold signal, e.g. without any selection parameter (if only one particular biasing waveform and only one particular threshold signal can be generated), or based on one selection parameter for the biasing waveform (e.g. if the biasing waveform can be selected from a plurality of predefined waveforms) and/or based on a selection parameter for the threshold signal (e.g. if the threshold waveform can be selected from a plurality of predefined waveforms) and/or based on one or more threshold values (e.g. a first value for Vt1 and a second value for Vt2).

The expression "using a predefined lookup table" may include performing linear interpolation.

The predefined mathematical formula may be a polynomial expression in one variable, e.g. to convert a single time value (T1) or a single count value (N1) or a single index value (index1) into said physical quantity, and this formula is applicable for a particular waveform of Vbias and a particular threshold value or a particular threshold function.

In an embodiment, the biasing signal is selected from a first group of a limited set of possible candidate biasing signals, and the threshold signal is selected from a second group of a limited set of possible values or threshold signals, and step d) takes into account which candidate of the first group, and which candidate of the second group was used.

In an embodiment, the biasing signal is a single predefined waveform, and the threshold signal is a constant value for a given measurement period, but may change for different measurement periods. In this case, a two-dimensional look-up table may be used in step d), or a mathematical formula in two variables (e.g. a first variable corresponding to the measured time or count or index, and a second variable or parameter corresponding to the threshold value that was applied).

In preferred embodiments, the steps a) to d) are performed at lease twice, e.g. repeatedly, e.g. periodically.

In an embodiment, step b) comprises: using a single threshold signal (e.g. Vt) having a predefined value or a configurable value or a predefined waveform or a configurable waveform; and step c) comprises: determining a single time value (e.g. T1) or a single count value (e.g. N1) or a single index value (e.g. index1) related to a single event (e.g. event1) at which the at least one output signal (e.g. Vp or Vn) passes said single threshold signal (e.g. Vt); and step d) comprises: determining said digital value (e.g. Dout) based on said single time value (e.g. T1) or count value (e.g. N1) or index value (e.g. index1).

As mentioned above, step d) may take into account (e.g. a reference to or parameters of) the waveform of the biasing signal (Vbias) used in step a), and/or may take into account the value or (e.g. a reference to or parameters of) the waveform of the threshold signal used in step b).

In an embodiment, Dout is a function of T1 and the biasing waveform and the threshold.

In an embodiment, Dout is a function of N1 and the biasing waveform and the threshold.

In an embodiment, Dout is a function of index1 and the biasing waveform and the threshold.

In an embodiment, only one predefined biasing waveform is used in step a), and only one predefined threshold value is used in step b), and Dout is determined as a function of T1 or N1 or Index1 in step d).

In an embodiment, Dout is determined as the result of a look-up table using T1 or N1 as an index, optionally with interpolation. The look-up table may take into account specifics of the biasing waveform and of the threshold.

In an embodiment, Dout is determined as the result of a polynomial expression of a single variable T1 or N1 or index1. The coefficients of the polynomial expression can take into account specifics of the biasing waveform and of the threshold.

In an embodiment, the sensor circuit or the bridge circuit has two output nodes (e.g. RO1, RO2); and step a) causes the two output nodes (e.g. RO1, RO2) to provide a first time-varying output signal (e.g. Vp) and a second time-varying output signal (e.g. Vn); and step b) comprises: using (e.g. generating) a first threshold signal (e.g. Vt, Vt1) having a first predefined or a first configurable value or a first predefined waveform, and using (e.g. generating) a second threshold signal (e.g. Vt, Vt2) equal to, or different from the first threshold signal, having a second predefined value or a second configurable value or a second predefined waveform; and the method further comprises step e) of generating a time-varying common-mode signal (e.g. Vcm) e.g. as R*Vbias or as (Vp+Vn)/2, where R is a predefined ratio, and Vbias is the biasing signal (e.g. biasing voltage); and wherein step c) comprises: determining a first time value (e.g. T1) or a first count value (e.g. N1) or a first index value (e.g. index1) related to a first event (e.g. event1) at which the first output signal (e.g. v1, Vp) passes the first threshold signal (e.g. Vt1); and determining a second time value (e.g. T2) or a second count value (e.g. N2) or a second index value (e.g. index2) related to a second event (e.g. event2) at which the common-mode signal (e.g. Vcm) passes the second threshold signal (e.g. Vt, Vt2); and wherein step d) comprises: determining said digital value (e.g. Dout) based on said first and second time value (e.g. T1, T2) or based on said first and second count value (e.g. N1, N2) or based on said first and second index value (e.g. index1, index2), or based on a difference (e.g. ΔT) between the first and second time value, or based on a difference (e.g. ΔN) between said first and second count value, or based on a difference (e.g. Δindex) between said first and said second index value.

In an embodiment, the common-mode signal, e.g. common mode voltage (e.g. Vcm) is generated as an average of the two readout voltages (e.g. Vp, Vn), or by adding the two readout voltages and dividing the sum signal by two.

In an embodiment, the common-mode signal, e.g. common mode voltage (e.g. Vcm) is generated as a predefined ratio of the biasing voltage that is applied in step a), or as a predefined ratio of a supply signal, (e.g. a supply voltage or a supply current).

As mentioned above, step d) may take into account the waveform of the biasing signal (Vbias) used in step a), and/or may take into account the value(s) or the waveform(s) of the threshold signal(s) used in step b).

In an embodiment, step b) comprises: using (e.g. generating) a first threshold signal (e.g. Vt, Vt1) having a first predefined or a first configurable value or a first predefined waveform, and using (e.g. generating) a second threshold signal (e.g. Vt, Vt2) equal to, or different from the first threshold signal, having a second predefined value or a second configurable value or a second predefined waveform; and step c) comprises: determining a first time value (e.g. T1) or a first count value (e.g. N1) or a first index value (e.g. index1) related to a first event (e.g. event1) at which the first output signal (e.g. v1, Vp) passes the first threshold signal (e.g. Vt, Vt1); and using a predefined second time value (e.g. T2ref) or a predefined second count value (e.g. N2ref) or a second index value (e.g. index2ref) related to a second event (e.g. event2) at which a common-mode signal (e.g. Vcm) e.g. as R*Vbias or as (Vp+Vn)/2, where R is a predefined ratio, and Vbias is the biasing signal (e.g. biasing voltage) would pass the second threshold signal (e.g. Vt, Vt2); and wherein step d) comprises: determining said digital value (e.g. Dout) based on said first and second time value (e.g. T1, T2ref) or based on said first and second count value (e.g. N1, N2ref) or based on said first and second index value (e.g. index1, index2ref), or based on a difference (e.g. ΔT) between the first and second time value, or based on a difference (e.g. ΔN) between said first and second count value, or based on a difference (e.g. Δindex) between said first and said second index value.

As mentioned above, step d) may take into account the waveform of the biasing signal (Vbias) used in step a), and/or may take into account the value(s) or the waveform(s) of the threshold signal(s) used in step b).

In an embodiment, the at least one threshold signal or threshold value (e.g. Vt; Vtp, Vtn) has a predefined voltage level or a predefined value.

In an embodiment, the at least one threshold signal (e.g. Vt; Vtp, Vtn) has a configurable voltage level or a configurable value.

In an embodiment, the at least one threshold signal or value (e.g. Vt) is dynamically adjustable between two measurements but is kept stable during a single measurement (or digitization step), i.e. during a time period T-ramp of FIG. 5.

In an embodiment, the at least one threshold signal is generated by means of a digital-to-analog convertor (DAC).

In an embodiment, the at least one threshold signal is generated as a PWM-signal (e.g. using a PWM-module) followed by a low-pass filter (LPF).

In an embodiment, the at least one threshold signal (e.g. Vt; Vtp, Vtn) is equal to a predefined ratio of a maximum biasing signal or as a predefined ratio of the supply signal (e.g. supply voltage). The predefined ratio may be defined using a voltage divider comprising at least two resistors connected in series, or in any other suitable way. In an embodiment, the value of threshold signal is a predefined portion or fraction of Vbias or of the supply voltage VSS, e.g. 50%. The value of this portion can be defined by the resistor values of the at least two resistors connected in series.

In an embodiment, the sensor circuit or the bridge circuit has two output nodes (e.g. RO1, RO2); and step b) comprises: using (e.g. generating) a first threshold signal (e.g. Vt, Vt1) having a first predefined or a first configurable value or a first predefined waveform, and using (e.g. generating) a second threshold signal (e.g. Vt, Vt2) equal to, or different from the first threshold signal, having a second predefined value or a second configurable value or a second predefined waveform; and step a) causes the two output nodes (e.g. RO1, RO2) to provide a first time-varying output signal (e.g. Vp) and a second time-varying output signal (e.g. Vn); and step c) comprises: determining a first time value (e.g. T1) or a first count value (e.g. N1) or a first index value (e.g. index1) related to a first event (e.g. event1) at which the first output-signal (e.g. Vp) passes the first threshold signal (e.g. Vt, Vt1); and determining a second time value (e.g. T2) or a second count value (e.g. N2) or a second index value (e.g. index2) related to a second event (e.g. event2) at which the second output-signal (e.g. Vn) passes the second threshold signal (e.g. Vt, Vt2); and step d) comprises: determining said digital value (e.g. Dout) based on said first and second time value (e.g. T1, T2) or based on said first and second count value (e.g. N1, N2) or based on said first and second index value (e.g. index1, index2), or based on a difference (e.g. ΔT) between the first and second time value, or based on a difference (e.g. ΔN) between said first and second count value, or based on a difference (e.g. Δindex) between said first and said second index value.

As mentioned above, step d) may take into account the waveform of the biasing signal (Vbias) used in step a), and/or may take into account the value(s) or the waveform(s) of the threshold signal(s) used in step b).

In an embodiment, the method further comprises: determining a first threshold value (e.g. Val1) and a second threshold value (e.g. Val2), and applying these values to at least one digital-to-analog convertor to generate the first and second threshold signal (e.g. Vt1, Vt2), and dynamically adjusting these values (e.g. Val1, Val2) in a control loop such that the first event substantially coincides with the second event, or such that a difference between the first and the second time value (e.g. T1, T2) or a difference between the first and the second count value (e.g. N1, N2) is substantially equal to a predefined value; and step d) comprises: considering the first and the second threshold value (e.g. Val1, Val2) as a first and second index value, and determining said digital value (e.g. Dout) based on said first and second (e.g. index1, index2) or based on a difference (e.g. Δindex) between the first and second index.

In this embodiment, step d) may take into account, explicitly or implicitly, the waveform of the biasing signal (Vbias) used in step a) if different biasing waveforms are used, but does not need to do so if only a single biasing waveform is used, e.g. in every period.

Step d) may take into account the predefined difference value (or offset) between T1 and T2, or the predefined difference value between N1 and N2 of the control loop, if this difference value is configurable, but in preferred embodiments, this difference (of offset) is not configurable.

In embodiments where the biasing waveform is a single waveform, and the predefined difference value of the control loop is fixed (e.g. hardcoded), the digital value "Dout" can be determined solely based on the value Δindex, e.g. using a look-up table that contains values determined during a calibration procedure, or derived therefrom, or using one or more mathematical formulas with predefined parameters and/or coefficients, which may be determined during a calibration procedure, codifying substantially the same information as the look-up table.

In an embodiment, the digital value "Dout" is determined solely based on the value of index1 (i.e. the value Val1), or solely based on the value of index2 (i.e. the value Val2).

In an embodiment, the control loop is configured to dynamically adjusts the value Val1 such that the first event (at which Vp crosses Vt1) always occurs substantially at a first predefined moment in time (e.g. T1target), and such that the second event (at which Vn crosses Vn1) always occurs substantially at a second predefined moment in time (e.g. T2target), where T1target and T2target have a predefined relation with respect to the period Tperiod, e.g. T1target=50% of Tperiod, and T2target=60% of Tperiod, but of course, other percentages can also be used.

The method may also comprise a step of: i) providing a sensor or bridge circuit having two excitation nodes (e.g. E1, E2) and at least one output node (e.g. RO1, RO2), e.g. a Hall element, a horizontal Hall element, a vertical Hall element, or a Wheatstone bridge, or a resistor bridge comprising at least one or at least two legs, each leg comprising at least two resistors, e.g. piezo-electric resistors, or magneto-resistive resistors, e.g. XMR, GMR, TMR, AMR.

The method may further comprise: providing one or more of the following: a timer, a counter operating at a predefined clock frequency (e.g. fCLK), a biasing circuit (e.g. a variable voltage source or a variable current source), one or more comparators, an analog-to-digital convertor (ADC), a digital-to-analog convertor (DAC), a PWM circuit followed by a low-pass filter, a look-up-table with an index.

The method may also comprise the steps of: providing at least one comparator, e.g. one comparator or two comparators; and providing at least one threshold voltage (e.g. Vt) to a first input of the at least one comparator; and providing at least one out voltage (e.g. Vp, Vn) to a second input of the at least one comparator. In this case, the first event can be detecting e.g. by monitoring when an output level of the comparator changes state.

The method may also comprise the steps of: providing at least one analog-to-digital convertor (ADC); and step a) may further comprise: repeatedly digitizing said at least one output voltage or a differential voltage formed by both output voltages using said ADC; and step b) may further comprise: repeatedly comparing said plurality of digital values with at least one threshold value (e.g. by comparison means, e.g. by a programmable controller).

In an embodiment, at least step b) and c) are performed by a programmable controller, e.g. by a programmable digital processor. This controller may or may not be integrated in the same semiconductor substrate as the sensor circuit or bridge circuit.

In a preferred embodiment, step c) comprises: detecting when the readout-voltage or the common-mode voltage passes the relevant threshold voltage by generating an interrupt signal when an output level of the at least one comparator changes. Using an interrupt avoids the use of polling routines and is more power efficient.

In an embodiment, the biasing signal of step a) has a waveform with a linearly increasing or a linearly decreasing portion; (also referred to as "ramp". The ramp may have a configurable slope and/or a configurable offset).

In an embodiment, the biasing signal of step a) has a waveform with an exponential portion; (e.g. as can be generated by an RC circuit)

In an embodiment, the biasing signal of step a) has a sinusoidal waveform.

In an embodiment, the method further comprises a step of: measuring a temperature, and further comprising the step of: adjusting the at least one threshold voltage based on the measured temperature, or adjusting at least one of: the first time value (e.g. T1), the second time value (e.g. T2), the first count value (e.g. N1), the second count value (e.g. N2), the first index value (e.g. index1), the second index value (e.g. index2), the time difference (e.g. ΔT), the count difference (e.g. ΔN), the index difference (e.g. Δindex), the digital value (e.g. Dout) based on the measured temperature.

In an embodiment, the sensor is or comprises at least one Hall element; (e.g. a horizontal Hall element, or a vertical Hall element).

In an embodiment, the bridge circuit is or comprises at least one Wheatstone bridge. The Wheatstone bridge may comprise four resistors, including one or more MR elements (e.g. AMR, TMR, GMR, XMR). The Wheatstone bridge may comprise four resistors, including one or more piezo-resistive elements.

In an embodiment, the bridge circuit comprises multiple legs, and wherein each leg comprises at least two resistors.

In an embodiment, the bridge circuit comprises multiple legs, and wherein each leg comprises at least two resistors.

According to a second aspect, the present invention also provides a circuit (e.g. a "sense and digitization circuit) for providing a digital value (e.g. Dout) indicative of a physical quantity to be measured by a sensor or a bridge circuit that has two excitation nodes (e.g. E1, E2) and at least one readout node (e.g. RO1, RO2), the circuit comprising: a biasing circuit; (preferably this biasing signal is applied to all the sensors simultaneously); a threshold generator for generating at least one threshold signal or value; at least one of the following: a timer, a counter, a lookup-table with a DAC; comparison means (for comparing the at least one readout voltage (e.g. Vp) or a signal or value derived therefrom and the at least one threshold signal or value; a controller configured for performing a method according to any of the first aspect.

In embodiments where the sensor or bridge circuit has two readout-nodes, this "circuit" may also be referred to as "a circuit for digitizing the differential output signal of said sensor or bridge circuit".

It is noted that the threshold signal may be an analog signal (e.g. a threshold voltage), or According to a third aspect, the present invention also provides an integrated sensor device comprising: at least one sensor or bridge circuit that has two excitation nodes (e.g. E1, E2) and at least one readout node (e.g. RO1, RO2); at least one circuit according to the second aspect, operatively connected to the excitation nodes and the at least one readout node of said at least one sensor or bridge circuit.

In an embodiment, the integrated sensor device is a pressure sensor device, and comprises at least one Wheatstone bridge comprising a plurality of piezo-resistive elements.

In an embodiment, the integrated sensor device is a magnetic sensor device, and comprises at least one Wheatstone bridge comprising a plurality of magneto-resistive elements (e.g. AMR, GMR, XMR, TMR).

In an embodiment, the integrated sensor device is a magnetic sensor device, and comprises at least one Horizontal Hall element, and/or at least one vertical Hall element.

In an embodiment, the integrated sensor device comprises a plurality of at least two sensor or bridge circuits.

In an embodiment, the integrated sensor device is a linear or an angular position sensor device, a proximity sensor, a current sensor, or a torque sensor. In this case, the circuit may be further configured for outputting the digital value, or a value derived therefrom, e.g. a linear or an angular position, a current value, a torque value.

In an embodiment, the integrated sensor device further comprises one or two comparators or three for each sensor or bridge circuit (e.g. one for v1 or vp, one for v2 or vn, one for Vcm); wherein an output of each comparator is connected to a respective input of the controller.

Preferably the inputs of the controller are configured to generate an interrupt for the controller, and preferably the controller has an interrupt routine for storing a time value or a counter value when the interrupt occurs.

In an embodiment, only one of the readout nodes is used, e.g. because the second time value or count value or index value is based on a reference time or a reference count, or because the common-mode signal is derived from the biasing signal. In this case, a single comparator per sensor or per bridge circuit may be used.

In an embodiment, both readout nodes is used, e.g. because the second time value or count value or index value is based on a second event wherein the second readout signal or value passes a threshold. In this case, two comparators per sensor or per bridge circuit may be used.

In an embodiment, the circuit (e.g. "sense and digitization circuit") is configured for providing a first digital value (e.g. Dout1); and the integrated sensor device further comprises an analog-to-digital convertor (e.g. ADC) configured for digitizing one or both of the readout voltages (e.g. Vp, Vn) or for digitizing a differential voltage (e.g. Vdiff) formed by both readout nodes (e.g. RO1, RO2), and for providing a second digital value (e.g. Dout2); and the sensor device is further configured for providing the first and the second digital value (e.g. Dout1, Dout2) for allowing an external controller to perform a consistency test, or being further configured for performing a consistency test of the first and second digital value (e.g. Dout1, Dout2), and to provide at least one of the first and second digital value or a digital value derived therefrom and an error signal.

In other words, this integrated sensor device is configured for performing at least the steps (i) and (ii) of the method illustrated in FIG. 14.

According to a fourth aspect, the present invention also provides a method of providing a digital value (e.g. Dout) indicative of a physical quantity to be measured by a sensor or a bridge circuit that has two excitation nodes (e.g. E1, E2) and at least one output node (e.g. RO1, RO2), e.g. two readout nodes, the method comprising the steps of: a) applying a biasing signal (e.g. Vbias) e.g. a biasing voltage or a biasing current to the excitation nodes (e.g. E1, E2), causing the at least one output node (e.g. RO1, RO2) to provide at least one output signal (e.g. Vp, Vn), e.g. an output voltage or an output current; and applying a threshold signal (e.g. Vt), at least one of the biasing signal and the threshold signal being a time-varying signal; b) determining at least one time value (e.g. T1) or at least one count value (e.g. N1) or at least one index value (e.g. index1) related to a first event (e.g. event1) at which the at least one readout signal (e.g. Vp) passes at least one threshold signal (e.g. Vt); c) determining a digital value (e.g. Dout) indicative of the physical quantity to be measured based on said at least one time value (e.g. T1) or said at least one count value (e.g. N1) or said at least one index value (e.g. index1).

In an embodiment, the method comprises: applying a time-varying biasing signal and a time-varying threshold signal.

In an embodiment, the method comprises: applying a constant biasing signal and a time-varying threshold signal.

According to a fifth aspect, the present invention also provides a method of providing a digital value (e.g. Dout) indicative of a physical quantity to be measured by a sensor or a bridge circuit that has two excitation nodes (e.g. E1, E2) and at least one output node (e.g. RO1, RO2), e.g. two readout nodes, the method comprising the steps of: a) applying a time-varying biasing signal (e.g. Vbias) e.g. a biasing voltage or a biasing current to the excitation nodes (e.g. E1, E2), causing the at least one output node (e.g. RO1, RO2) to provide at least one time-varying output signal (e.g. Vp, Vn), e.g. an output voltage or an output current; b) determining at least one time value (e.g. T1) or at least one count value (e.g. N1) or at least one index value (e.g. index1) related to a first event (e.g. event1) at which the at least one readout signal (e.g. Vp) passes at least one threshold signal (e.g. Vt); c) determining a digital value (e.g. Dout) indicative of the physical quantity to be measured based on said at least one time value (e.g. T1) or said at least one count value (e.g. N1) or said at least one index value (e.g. index1).

In an embodiment, step b) comprises: determining a first time value (e.g. T1) or a first count value (e.g. N1) or a first index value (e.g. index1) related to a first event (event1) at which the first output-signal (e.g. Vp) passes a first threshold signal (e.g. Vt, Vt1); and determining a second time value (e.g. T2) or a second count value (e.g. N2) or a second index value (e.g. index2) related to a second event (e.g. event2) at which the second output-signal (e.g. Vn) passes a second threshold signal (e.g. Vt, Vt2), equal to, or different from the first threshold signal; and step c) comprises: determining a digital value (e.g. Dout) indicative of a physical quantity to be measured by the sensor or bridge circuit based on said first and second time value (e.g. T1, T2) or based on said first and second count value (e.g. N1, N2) or based on said first and second index value (e.g. index1, index2), e.g. based on a difference (ΔT) between the first and second time value, or based on a difference (ΔN) between the first and second count value, or based on a difference (Δindex) between the first and second index value, optionally taking into account the waveform of the biasing signal and/or the value or waveform of the at least one threshold signal.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

Figure 1:
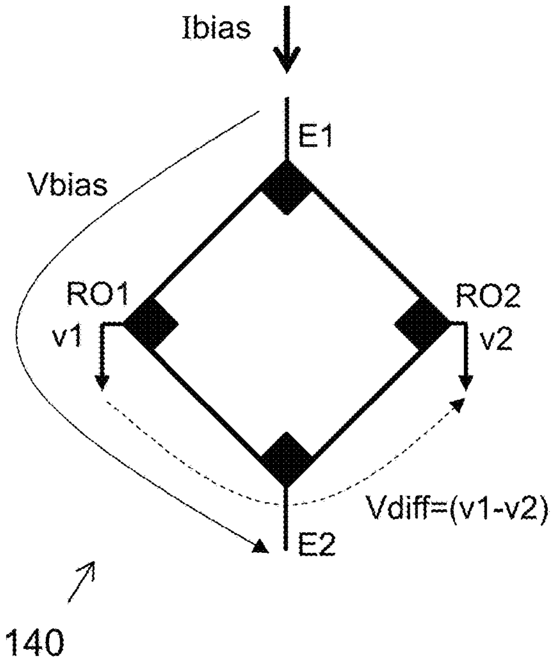
FIG. 1 shows a schematic block-diagram of a horizontal Hall element.

The drawings are only schematic and are non-limiting. In the drawings, the size of some of the elements may be exaggerated and not drawn on scale for illustrative purposes. Any reference signs in the claims shall not be construed as limiting the scope. In the different drawings, same or similar reference signs may refer to same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the expression "count value" or "counter value" mean the same. The counter may be configured to increment by 1, or to decrement by 1, but the present invention is not limited thereto.

The present invention relates in general to methods and circuits for providing a digital value (e.g. Dout) indicative of a physical quantity (e.g. a magnetic field value, or a pressure value) to be measured by a sensor circuit, and more specifically, to methods and circuits for digitizing an output signal (e.g. a differential output signal vdiff) of a sensor circuit or a bridge circuit of the type that has two excitation nodes (also referred to as "input nodes") and at least one (e.g. two) readout node (also referred to as "output nodes").

FIG. 1 shows an example of such a sensor circuit, namely a horizontal Hall element 140, but the present invention is not limited thereto, and also works e.g. for a vertical Hall element. When a biasing signal (e.g. a biasing voltage or a biasing current) is applied to the Hall element, a differential signal (e.g. an output voltage or an output current) will occur over the output nodes that is indicative of a magnetic field characteristic. But the voltage between nodes RO1 and E2 can be seen as another differential voltage, and the voltage between nodes RO2 and E2 can be seen as another differential voltage.

Figure 2A:
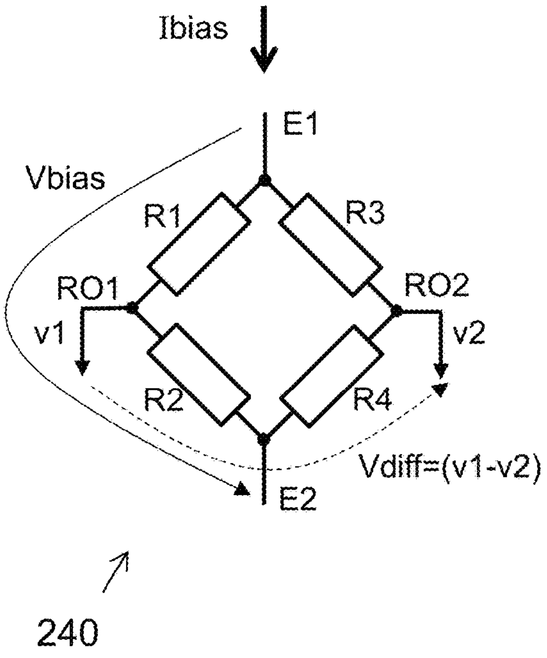
FIG. 2A shows a schematic block-diagram of a Wheatstone bridge comprising four resistors.
Figure 2B:
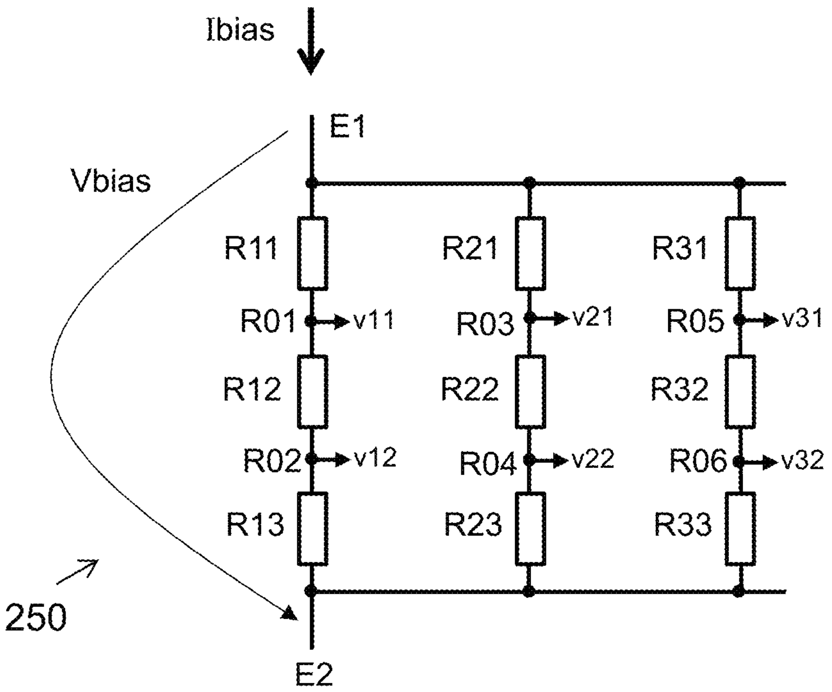
FIG. 2B shows a schematic block-diagram of a bridge circuit having three legs (also referred to as "half-bridge"), each comprising three resistors.

FIG. 2A shows an example of a bridge circuit 240, namely a Wheatstone bridge comprising four resistors R1, R2, R3, R4. The resistors may be piezo-electrical resistors formed e.g. on a silicon membrane for measuring a pressure, or may be magneto-resistive (MR) elements (e.g. GMR, XMR, TMR, AMR elements) indicative of a magnetic field characteristic, but the present invention is not limited to full bridge circuits having two legs, each leg having one readout-node, but e.g. also works for one or more half bridges each having one or more readout-nodes, e.g. as illustrated in FIG. 2B, showing a bridge circuit having three legs, each leg having three resistors, and two readout nodes. Many differential voltages can be obtained from this circuit, e.g. between the readout-nodes RO1 and RO3, or between the nodes RO3 and RO5, or between the nodes RO3 and RO6, or between the nodes RO2 and E2, just to name a few.

Figure 3:
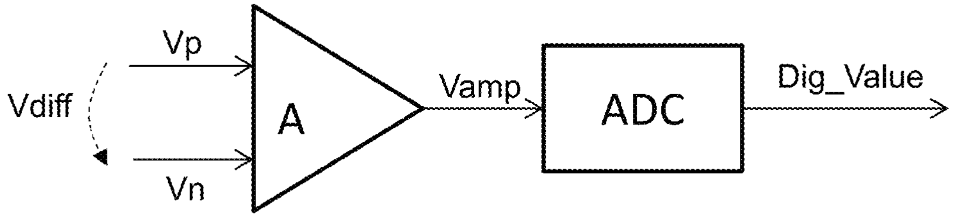
FIG. 3 shows a schematic block-diagram of a circuit for digitizing a differential voltage signal, such as the differential output voltage obtained from the sensor circuit of FIG. 1 or from the bridge circuit of FIG. 2A.

FIG. 3 shows a classical circuit for sensing and digitizing a differential voltage signal Vdiff, e.g. obtained from a horizontal Hall element as illustrated in FIG. 1, or from a vertical Hall element (not shown), or from a Wheatstone bridge as illustrated in FIG. 2A, or from a bridge-circuit 250 as illustrated in FIG. 2B, or from another sensor circuit or bridge circuit having at least two excitation nodes E1, E2 and at least one output node RO1. As described above, a differential voltage can be obtained between two readout nodes (e.g. RO1, RO2), but can also be obtained between a readout node (e.g. RO1) and an excitation node (e.g. E2). The classical sensing and digitization circuit of FIG. 3 was already discussed in the background section, and is well known in the art.

Figure 4:
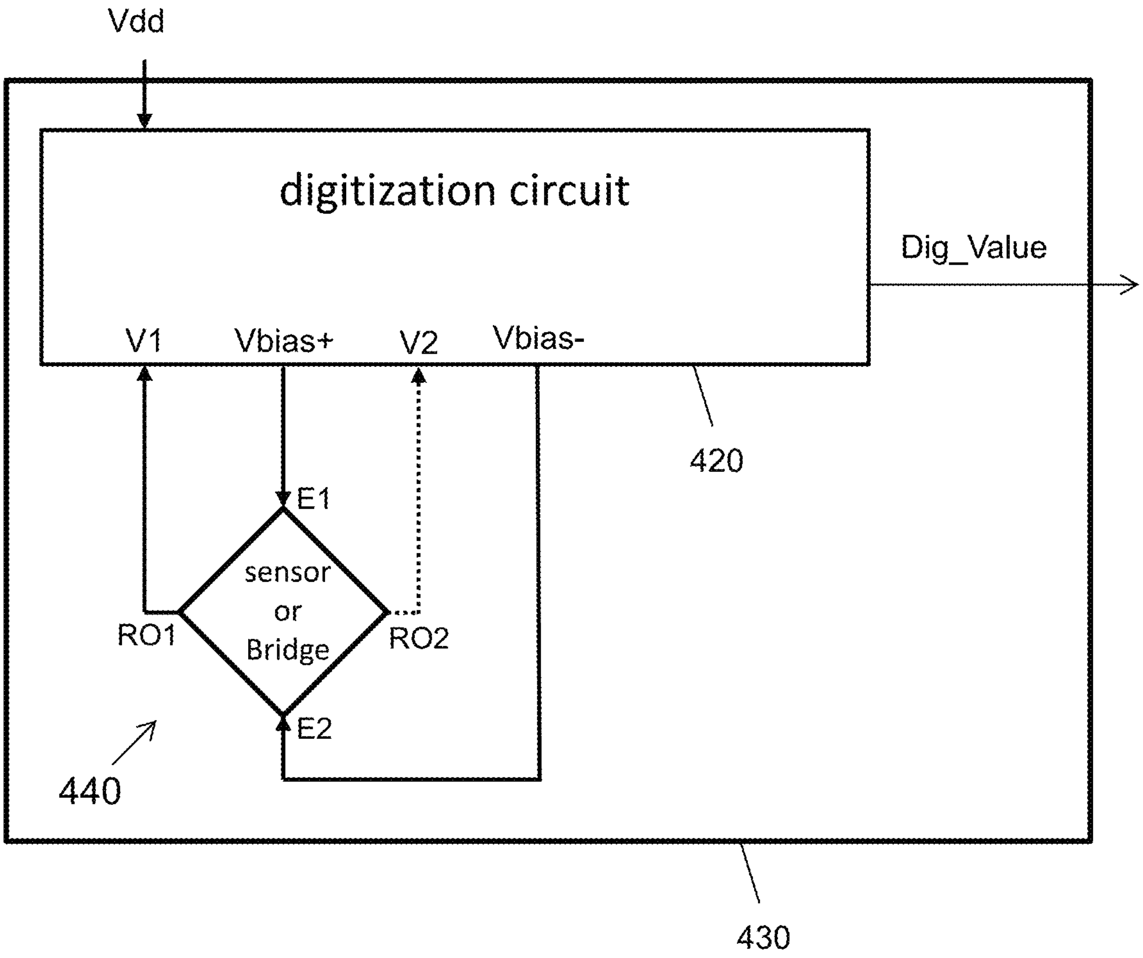
FIG. 4 shows an abstract high-level block-diagram of digitization circuits and integrated sensor devices proposed by the present invention.

FIG. 4 shows an abstract high-level block-diagram of a sensor or bridge 440 having two input nodes E1, E2 and two output nodes RO1, RO2, and a digitization circuit 420 operatively connected to said sensor or bridge 440. As can be seen, the digitization circuit 420 is configured to provide biasing signals (e.g. a biasing voltage or a biasing current) to the input nodes E1, E2 of the sensor or bridge, and is configured to receive at least one output voltage, e.g. two output voltages v1, v2 from the sensor or bridge. Depending on the implementation, the digitization circuit 420 may consider for example the signals V1 and V2 as a differential voltage signal to be digitized, or may consider the signals V1 and "Vbias−" as a differential voltage signal. The digitization circuit 420 is configured to convert this differential voltage signal into a digital value, which can also be referred to as "to digitize" the differential voltage signal, or actually, to digitize the physical signal being measured, such as e.g. a magnetic field, a pressure, etc.

FIG. 4 also shows an integrated sensor device 430 that comprises such a sensor or bridge 440 and such a digitization circuit 420.

In a variant, the digitization circuit 420 does not provide a differential biasing voltage formed by Vbias+ and Vbias−, but provides a "single-ended" biasing voltage Vbias to the first input node E1, while the second input node E2 is connected to a reference voltage (typically referred to as Vss or Gnd).

In another or a further variant, the digitization circuit 420 provides a biasing current rather than a biasing voltage. This biasing current may be provided by a "current source".

FIG. 5 to FIG. 9 and FIG. 14 shows various illustrative examples of graphs showing one or more of the following signals: a biasing signal Vbias, one or two readout-signals Vp and Vn, at least one threshold signal Vt, a common-mode signal Vcm, some or all of which signals may be used in embodiments of the present invention.

Figure 5:
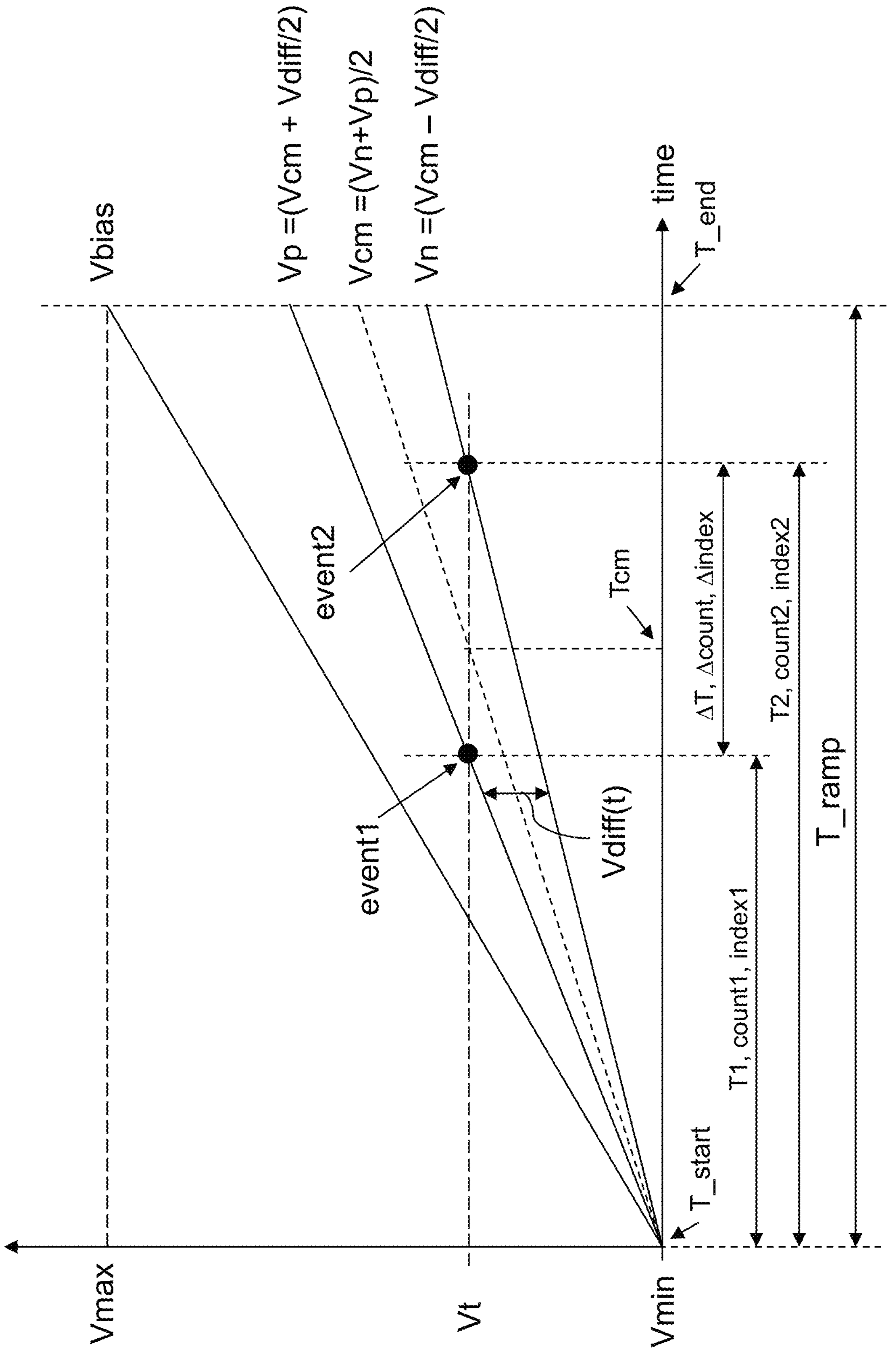
FIG. 5 to FIG. 9 show illustrative examples of graphs, each showing a time-varying biasing signal, one or two readout-signals, and one or two threshold signals, as may be used to illustrate principles underlying the present invention.

FIG. 5 shows an illustrative example of a graph used to illustrate certain principles as may be used in embodiments of the present invention.

The graph of FIG. 5 shows multiple curves, including a time-varying biasing voltage signal Vbias, which in the example of FIG. 5, linearly increases over time from a first value Vmin at a time T_start, to a second value Vmax at a time T_end. When this time-varying biasing voltage Vbias (t) is applied to the first input node E1 of the sensor or bridge 440 of FIG. 4, the output nodes RO1 and RO2 will provide two time-varying signals v1 and v2, together forming a time-varying differential output voltage vdiff. In reality the voltage level of v1 may be larger than the voltage level of v2, e.g. depending on whether the magnetic field being measured is positive or negative, or e.g. depending on whether the variable resistor(s) of the bridge have a resistance smaller or larger than the other resistors. In order to keep the drawings simple, not v1 and v2 are shown, but Vp and Vn, where Vp represents the output signal with the "higher" voltage level, and Vn represents the output signal with the "lower" voltage level.

FIG. 5 also shows a common-mode signal Vcm, which in this example is defined as the average of the output voltages v1 and v2, or as the average of Vp and Vn. This can be written mathematically as: Vcm=(Vn+Vp)/2. The signal Vp can then also be written as Vp=Vcm+(Vdiff/2), and the signal Vn can then also be written as Vn=Vcm−(Vdiff/2). It is noted that in some embodiments (see e.g. FIG. 6B), this common-mode signal Vcm may optionally be explicitly generated, e.g. by summing the output signals (e.g. using an operational amplifier), and by dividing the result by 2 (e.g. using a voltage divider comprising two resistors connected in series), or in any other suitable way.

In an embodiment, the signal Vcm is derived directly from Vbias, e.g. by means of a voltage divider comprising two resistors connected in series. The value of Vcm may be a predefined portion or fraction of Vbias, e.g. 50%. The value of this portion can be defined by the resistor values.

FIG. 5 also shows a threshold voltage Vt, which in the example of FIG. 5 has a predefined constant value, which does not change during the time interval, and which does not change over multiple time-intervals (only one time-interval is shown in FIG. 5). The present invention is however not limited hereto, and in other embodiments, the threshold voltage Vt may have a predefined waveform that changes within one time-interval (e.g. as a linearly decreasing function), or remains constant during the time-interval, but may have another constant value during a subsequent time-interval.

In certain embodiments of the present invention, the value of the threshold voltage Vt is in principle constant, but is temperature compensated.

As can be seen in the example of FIG. 5, the signal Vp passes the threshold voltage Vt at time T1 (defining a first event), and the signal Vn passes the threshold voltage at time T2 (defining a second event). The time T1 and T2 may be determined, e.g. measured using a timer (e.g. implemented in a digital processor), or using a counter operating at a predefined clock frequency fCLK.

Whereas in the prior art, a stationary biasing voltage equal to Vmax would be applied to the first input node E1 of the sensor or the bridge, and the signals Vn and Vp would be routed to an amplifier and the differential output voltage would be digitized (e.g. as illustrated in FIG. 3), the inventors of the present invention came to realize that the value of Vdiff, which is indicative of (e.g. proportional to) the physical quantity to be measured (e.g. a magnetic field component value, a pressure value, etc.), can for example also be derived from the time T1 and T2, and the biasing signal Vbias and the threshold signal Vt, e.g. by taking into account one or more of the values: Vmin, Vt, Vmax, T_ramp. This can be written mathematically as:

$$Dout=f1(T1,T2,\text{ waveform of biasing signal, }Vt) \quad [1]\text{, or as:}$$

$$Dout=f2(T2-T1,\text{ waveform of biasing signal, }Vt) \quad [2]\text{, or as:}$$

$$Dout=f3(N1,N2,\text{ waveform of biasing signal, }Vt) \quad [3]\text{, or as:}$$

$$Dout=f4(N2-N1,\text{ waveform of biasing signal, }Vt) \quad [4]\text{,}$$

where T1 is the time of event1, and T2 is the time of event2, where (T2−T1)=ΔT is the time difference between the first and the second event, or as:

where N1 is a first count value related to event1, and N2 is a second count value related to event2, where (N2−N1)=ΔN is the count difference between the first and the second event, wherein the Vbias waveform may be represented by a set of parameters such as e.g. Vmin, Tstart, Vmax, Tend, or by a set of parameters Vmin, Vmax, slope;

or if the biasing signal is generated using a DAC and an indexed table (e.g. stored in a non-volatile memory):

$$Dout=f5(\text{index1},\text{index2},Vt) \quad [5], \text{ or as:}$$

$$Dout=f6(\text{index2}-\text{index1},Vt) \quad [6]$$

In certain embodiments, the waveform of the biasing signal Vbias is fixed, (e.g. hardcoded in software, or generated in a predetermined manner by a hardware-circuit), and also the value of the threshold-voltage Vt is fixed (e.g. a predefined voltage level). In such a case, there is a one-to-one relation between the magnitude of the physical quantity to be measured (e.g. magnetic field value or pressure value) and the timing of the first event at which Vp crosses Vt, and the timing of the second event at which Vn crosses Vt. This relation can for example be determined during a calibration test, and the results may be stored in a look-up table. One could say that the values of the look-up table implicitly take into account specifics of the biasing signal and the threshold signal. It is noted that the waveform of Vbias and/or of the threshold signal Vt need not be known. With this a lookup table, the digital output value can then be determined as:

$$Dout=\text{LookupTable7}[T2-T1] \quad [7], \text{ or as}$$

$$Dout=\text{LookupTable8}[N2-N1] \quad [8], \text{ or as}$$

$$Dout=\text{LookupTable9}[\text{index2}-\text{index1}] \quad [9]$$

The values of the look-up table may be stored in a non-volatile memory of the sensor device (see e.g. FIG. 17), and linear interpolation may be applied during retrieval.

It is noted that (T2−T1) can also be written as ΔT, thus the lookup-table can be a one-dimensional table. Likewise (N2−N1)=ΔN, (Index2−Index1)=ΔIndex.

It is also possible to express Dout as a polynomial expression of the single value (T2−T1)=ΔT, or of the single value (N2−N1)=ΔN, or of the single value (index2−index1)=ΔIndex, using a number of coefficients which may be determined during a calibration procedure, and may be stored in a non-volatile memory of the sensor device. One could say that the values of the coefficients implicitly take into account specifics of the biasing signal and the threshold signal. It is noted that the waveform of Vbias and/or of the threshold signal Vt need not be known. With polynomial the digital output value can then be determined as:

$$Dout=\text{Polynomial10}(T2-T1) \quad [10], \text{ or as}$$

$$Dout=\text{Polynomial11}(N2-N1) \quad [11], \text{ or as}$$

$$Dout=\text{Polynomial12}(\text{index2}-\text{index1}) \quad [12]$$

It is noted that (T2−T1)=ΔT is a single value, thus Polynomial10 is a function of a single variable ΔT. Likewise for Polynomial11 and Polynomial12.

The coefficients of these polynomials may be determined during a calibration test, using the same biasing signal Vbias and the same threshold signal Vt as will be used during actual use.

It is of course also possible to express Dout as a polynomial expression of two variables (T1, T2) or (N1, N2) or (Index1, Index2) using a number of coefficients, where the values of the coefficients take into account specifics of the biasing signal and the threshold signal. This can be written as:

$$Dout=\text{Polynomial13}(T1,T2) \quad [13], \text{ or as}$$

$$Dout=\text{Polynomial14}(N1,N2) \quad [14], \text{ or as}$$

$$Dout=\text{Polynomial15}(\text{index1},\text{index2}) \quad [15]$$

So far it is described how FIG. 5 illustrates a method of determining a digital value Dout indicative of a physical quantity measured by a sensor circuit 140 or a bridge circuit 240 as illustrated in FIG. 1 or FIG. 2A having two output nodes, can be determined, based on a value ΔT or ΔN or ΔIndex, corresponding to a time difference (T2−T1) or count difference (N2−N1) or index difference (index1−index2) between a first event (event1) at which a first output signal Vp passes a threshold signal Vt, and a second event (event2) at which a second output signal Vn passes that same threshold signal Vt, but this is not the only possible way how the physical quantity sensed by the sensor circuit 140 or bridge circuit 240 can be measured.

Indeed, if the waveform of Vbias as a function of time is known, (e.g. a predefined ramp waveform), then also the waveform of the common mode voltage Vcm corresponding to the average of Vp and Vn is known (explicitly or implicitly), which is also substantially equal to 50% of Vbias. And if the value of the threshold signal Vt (e.g. a predefined constant voltage level, or a predefined portion of Vmax) or if the waveform of Vt as a function of time is known, then also the time Tcm at which the waveform Vem passes Vt is known (explicitly or explicitly). Instead of measuring T1 of event1 (when Vp passes Vt) and measuring T2 of event2 (when Vn passes Vt), it is also possible to measure only T1, because the time T2 at which Vn will pass Vt is related to the time between T1 and Tcm. In other words, (Tcm−T1) and (T2−Tcm) are related to each other.

Thus, if the relation between Vem and Vbias is known, and if the relation between Vt and Vmax (i.e. the maximum value of Vbias) is known, then the value of Vdiff and thus of the physical quantity can be determined as a function of a single time T1. This can be written mathematically as:

$$Dout=f16(T1, \text{ waveform of biasing signal, } Vt) \quad [16]$$

$$Dout=f17(N1, \text{ waveform of biasing signal, } Vt) \quad [17]$$

wherein the Vbias waveform may be represented by a set of parameters such as e.g. Vmin, Tstart, Vmax, Tend, or by a set of parameters Vmin, Vmax, slope;

or if the biasing signal is generated using a DAC and an indexed table (e.g. stored in a non-volatile memory):

$$Dout=f18(\text{index1},Vt) \quad [18]$$

As already mentioned above, in practice the biasing signal Vbias may have a predefined waveform (e.g. a linearly increasing ramp), and the threshold signal may also have a predefined waveform (e.g. a linearly decreasing function, or a predefined constant value), and this biasing signal and threshold signal is repeatedly used for each measurement period. In such a case, there is a one-to-one correspondence between the physical quantity to be measured and the (single) time value T1, or single count value N1, or single index value Index1 related to the first event; this relation can be determined during a calibration test, and this relation can be stored in a non-volatile memory, e.g. in the form of a look-up table, or in the form of a polynomial expression, or in any other suitable way.

When using a look-up table that takes into account specifics of the biasing signal and the threshold signal, the digital output value can be determined as:

$$Dout=LookupTable19[T1] \quad [19], \text{ or as}$$

$$Dout=LookupTable20[N1] \quad [20], \text{ or as}$$

$$Dout=LookupTable21[index1] \quad [21]$$

It is also possible to express Dout as a polynomial expression of the single value (T1) or of the single count value (N1) or of the single index value (index1) using a number of coefficients, where the values of the coefficients take into account specifics of the biasing signal and the threshold signal. This can be written as:

$$Dout=Polynomial22(T1) \quad [22], \text{ or as}$$

$$Dout=Polynomial23(N1) \quad [23], \text{ or as}$$

$$Dout=Polynomial24(index1) \quad [24]$$

Figure 10:
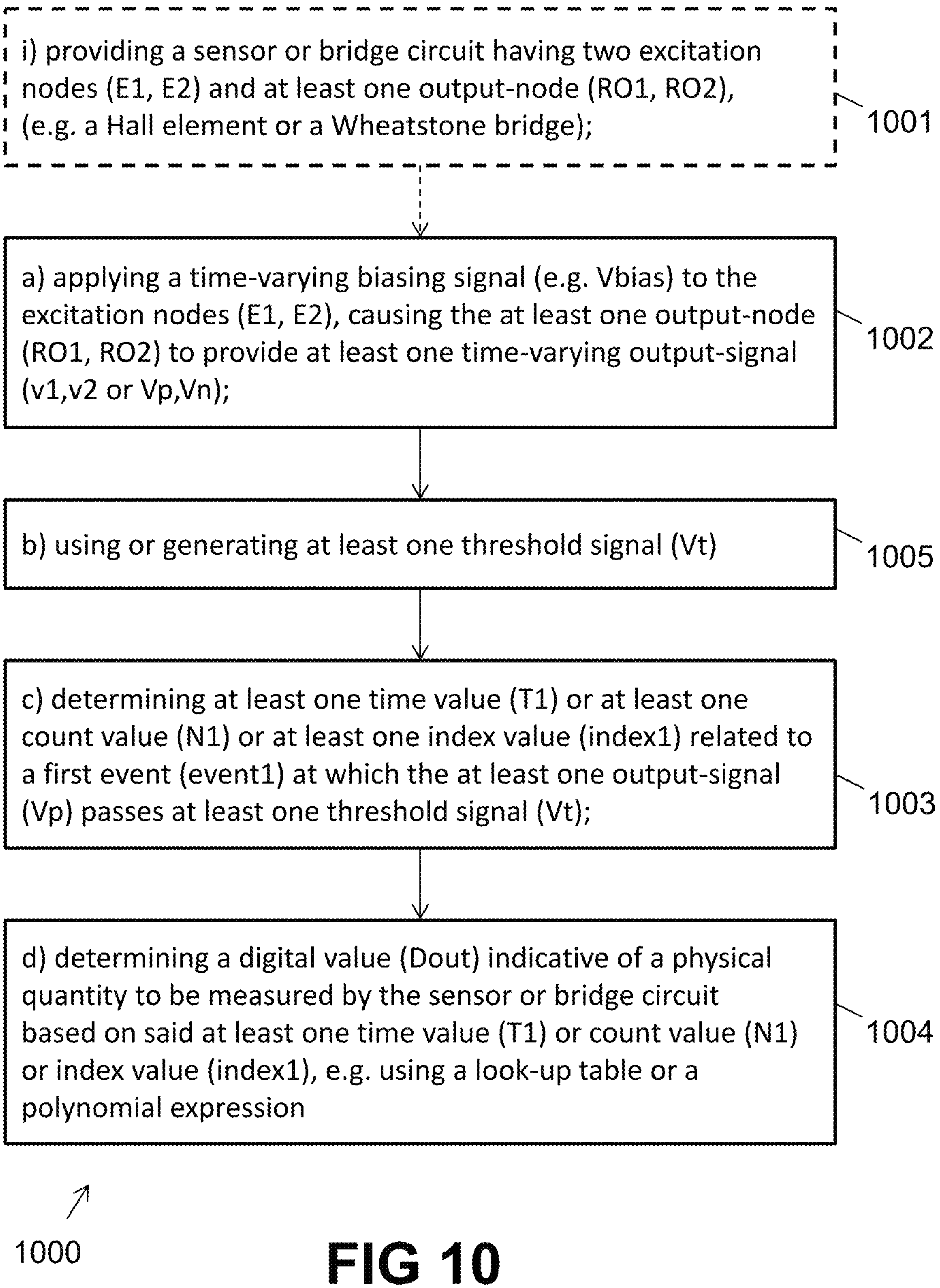
FIG. 10 to FIG. 14 show flow-charts of methods proposed by the present invention.

A method of determining a digital value indicative of a magnitude of a physical quantity to be measured (e.g. a magnetic field strength, a pressure) based on these principle is shown in FIG. 10.

It is noted that FIG. 5 is provided to show the basic principles of the present invention, which is particularly useful for a Hall element or for a Wheatstone bridge, (where Vp and Vn have a symmetric behaviour with respect to a common mode voltage Vcm) but the present invention is not limited thereto, and the same principles explained in FIG. 5 can e.g. also be used to determine a digital value for a physical quantity measured by a circuit having only one output node, for example a circuit consisting of two resistors in series, (e.g. two piezo-resistors or two magneto-resistors), where one or both resistor values vary as a function of an external physical quantity to be measured, which can be seen as a special case of the resistor circuit of FIG. 2B. Such a circuit also has two excitation nodes E1, E2 and at one output node (the node between the two resistors), and when a biasing signal Vbias is applied to the excitation nodes, a single output signal will be provided. Depending on the physical quantity to be measured, the moment T1 at which this output signal crosses the threshold voltage will vary. In other words, also in this case, when the biasing signal Vbias has a predefined waveform (e.g. a linearly increasing function), and when the threshold signal Vt has a predefined waveform or a predefined value), there will be a one-to-one correspondence between the time T1 (or count N1, or index Index1) at which the output signal crosses the threshold voltage. This relation between the physical quantity and T1 can be determined in a calibration procedure, and can be stored in a non-volatile memory, e.g. in the form of a look-up table, or in the form of a set of coefficients of a polynomial equation. The value of Dout can then also be determined using the formulas [19] to [24]. It is noted that the curves of FIG. 5 can also be used to understand how this method will work for a circuit having only two resistors, but only one output signal would be present (e.g. Vp).

The skilled person having the benefit of the present disclosure will also understand that the above described measurement principle (of applying a time-varying signal Vbias, and using a constant or a time-varying threshold signal Vt, and measuring a time T1 or a count N1 of a first event at which a node voltage passes the threshold signal Vt, in order to obtain a digital value for an external quantity to be measured) can also be applied for any individual node of the circuit of FIG. 2B. For each node of interest, a corresponding look-up table and/or coefficients of a polynomial function can be determined during a calibration procedure, and can be stored in a non-volatile memory of the sensor device. This look-up table or these coefficients can then be used later (during actual use of the sensor device) to convert the measured time value T1 or count value N1 or index value Index1 into a digital value of the physical quantity to be measured.

In another or a further variant of FIG. 5 (not shown), the sensor circuit may apply one of a plurality of possible biasing signals, e.g. either a first biasing signal having a first predefined waveform that linearly increases (see FIG. 5), or a second biasing signal having a second predefined waveform that exponentially increases. In this case, two (or more) look-up tables and/or two (or more) polynomial functions can be determined during a calibration test, and during actual use of the sensor device, the appropriate look-up table or polynomial function needs to be selected. Or stated in other words, in order to determine the output value, an additional parameter is required, namely a value to indicate which of the predefined biasing signals was used.

In another or a further variant, (e.g. as will be described further in FIG. 8A and FIG. 8B), the sensor circuit may have two output nodes (e.g. Vp and Vn), and the method may use either a single predefined threshold signal (Vt) for both events (event1 and event2), or may use a first predefined threshold signal (Vt1) for a first event, and use a second predefined threshold signal (Vt2) for the second event. Also in this case, two look-up tables and/or two polynomial functions can be determined during a calibration test, and during actual use of the sensor device, the appropriate look-up table or polynomial function needs to be selected. Or stated in other words, in order to determine the output value, an additional parameter is required, namely a value to indicate which of the predefined threshold signals was used.

It is also possible to use one of several possible biasing signals, and one of several possible threshold signals. In this case, in order to determine the digital output value, two additional parameters are needed: a first one to indicate the appropriate biasing signal, and a second one to indicate the appropriate threshold signals.

These and other variants of the method will be described and illustrated further, with reference to FIG. 6A to FIG. 9 and FIG. 14, but before doing so, a few other considerations of FIG. 5 will be described.

In the example of FIG. 5, the biasing signal is a ramp with a predefined slope, starting from a value Vmin equal to zero, but that is not absolutely required, and the ramp may also start at a non-zero (e.g. predefined) value.

In the example of FIG. 5, the ramp increases with time (i.e. has a positive slope), but it is also possible to use a ramp with a negative slope.

In certain embodiments, the first event may be detected using a first comparator having as a reference input the threshold voltage Vt, and having as a signal input the signal Vp; and the second event may be detected using a second comparator having as a reference input the threshold voltage Vt, and having as a signal input the signal Vn.

In an embodiment where the sensor circuit has only one output node (e.g. a resistor circuit having two resistors in series), the first event may be detected using a comparator, using the output voltage of the sensor circuit as an input signal for the comparator, and using the threshold voltage Vt as a reference signal for the comparator.

In the example of FIG. 5, the ramp is a continuous-time and continuous-value function (i.e. a “continuous ramp”), as can be generated e.g. using an operational amplifier, but the invention will also work with a discrete-time and discrete-value function, (i.e. a "discrete ramp"), or a "stepwise ramp", also known as a "staircase" function, where the amplitude of the biasing signal changes in discrete steps at discrete moments in time, as can e.g. be generated by a digital processor with a DAC, or by a digital processor with a PWM block followed by a low-pass filter (to reduce the voltage ripple). The biasing waveform may be generated using a counter or a look-up table or a memory, and the biasing signal may be generated by varying a counter value or an index value over time. An important advantage of this approach is that the detection of the first event (when Vp passes Vt) or the second event (when Vn passes Vt) boils down to determining the index-value of the biasing signal associated with these events, which is not or less dependent on clock-jitter, and thus the method becomes jitter-free. If furthermore Vt is derived from the same supply voltage applied also to said DAC or to said digital processor, the index value will also be less sensitive to supply voltage variations. As mentioned above, the biasing signal may be a voltage signal, or a current signal, or a charge signal. The ramp may be an increasing function or a decreasing function. The biasing signal may be but does not need to be a periodic signal which is repeated each time period. The biasing signal does not need to vary between a predefined value Vmin equal to zero and a predefined value Vmax, but may assume also other predefined waveforms.

The same methods and/or formulas as mentioned above can be used.

Figure 6A:
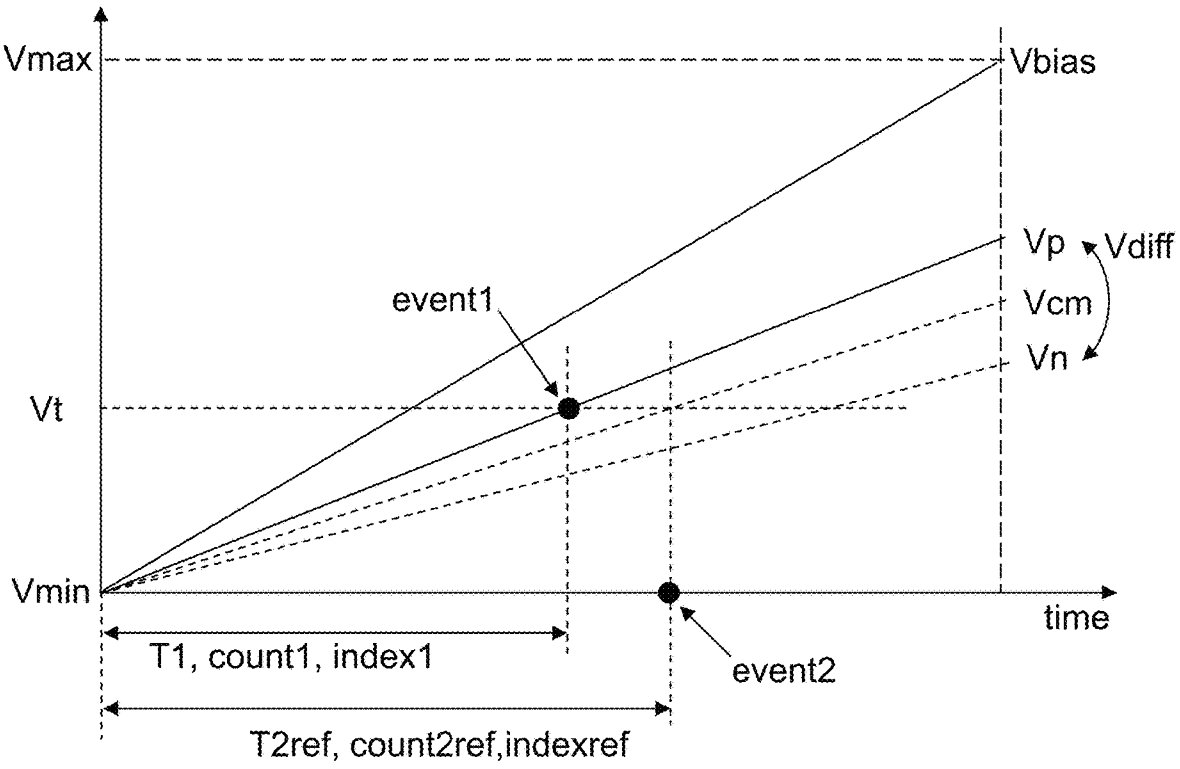

FIG. 6A shows a variant of the graph of FIG. 5, where the differential voltage signal of the sensor circuit 140 or bridge circuit 240 is determined by measuring a time T1 or counter value count1 corresponding to a first event at which Vp passes the threshold voltage Vt, and by considering a time T2 or counter value count2 corresponding to a second event at which the common mode voltage Vcm passes (e.g. explicit) or would pass (e.g. implicitly) the threshold voltage Vt. It is noted that this time T2 or count value count2 is independent of the magnetic field (or pressure or other physical quantity being measured), and may be implemented as a predefined time (e.g. T2ref) or as a predefined count value (e.g. count2ref or N2ref). As can be appreciated, the signal Vcm does not need to be actually available, since the signals Vcm and Vn are not explicitly used in this embodiment. In this case, the digital value of the physical quantity to be measured can be written mathematically as:

$$Dout=f25(T1,T2\text{ref, waveform of biasing signal},Vt) \quad [25]$$

$$Dout=f26(T2\text{ref}-T1,\text{ waveform of biasing signal, }Vt) \quad [26]$$

$$Dout=f27(N1,N2\text{ref, waveform of biasing signal},Vt) \quad [27]$$

$$Dout=f28(N2\text{ref}-N1,\text{ waveform of biasing signal, }Vt) \quad [28]$$

wherein the Vbias waveform may be represented by a set of parameters such as e.g. Vmin, Tstart, Vmax, Tend, or by a set of parameters Vmin, Vmax, slope;

or if the biasing signal is generated using a DAC and an indexed table (e.g. stored in a non-volatile memory):

$$Dout=f29(\text{index1},\text{index2},Vt) \quad [29]\text{, or as:}$$

$$Dout=f30(\text{index2}-\text{index1},Vt) \quad [30]$$

Or in case the biasing signal and/or the threshold signal have a predefined, e.g. built-in waveform, the specific shapes of these waveforms are not absolutely required for determining the output value, for the same reasons as described above, and the relationship between the physical quantity to be measured (e.g. a magnetic value of a pressure value) and the moment(s) when the output signal(s) of the sensor circuit cross the threshold signal(s) Vt can be determined by means of a calibration test, and be stored in a non-volatile memory, e.g. in the form of a look-up table or a polynomial expression. During actual use of the sensor device, the digital output value can then be determined as:

$$Dout=\text{LookupTable26}[T2\text{ref}-T1] \quad [31]\text{, or as}$$

$$Dout=\text{LookupTable27}[N2\text{ref}-N1] \quad [32]\text{, or as}$$

$$Dout=\text{LookupTable28}[\text{index2}-\text{index1}] \quad [33]$$

It is also possible to express Dout as a polynomial expression of the single value (T2ref−T1) or of the single value (N2ref−N1) using a number of coefficients, where the values of the coefficients take into account specifics of the biasing signal and the threshold signal. This can be written as:

$$Dout=\text{Polynomial34}(T2\text{ref}-T1) \quad [34]\text{, or as}$$

$$Dout=\text{Polynomial35}(N2\text{ref}-N1) \quad [35]$$

$$Dout=\text{Polynomial36}(\text{index2}-\text{index1}) \quad [36]$$

It is also possible to express Dout as a polynomial expression of two variables (T1, T2) or (N1, N2) or (Index1, Index2) using a number of coefficients, where the values of the coefficients take into account specifics of the biasing signal and the threshold signal. This can be written as:

$$Dout=\text{Polynomial37}(T1,T2) \quad [37]\text{, or as}$$

$$Dout=\text{Polynomial38}(N1,N2) \quad [38]\text{, or as}$$

$$Dout=\text{Polynomial39}(\text{index1},\text{index2}) \quad [39]$$

Figure 11:
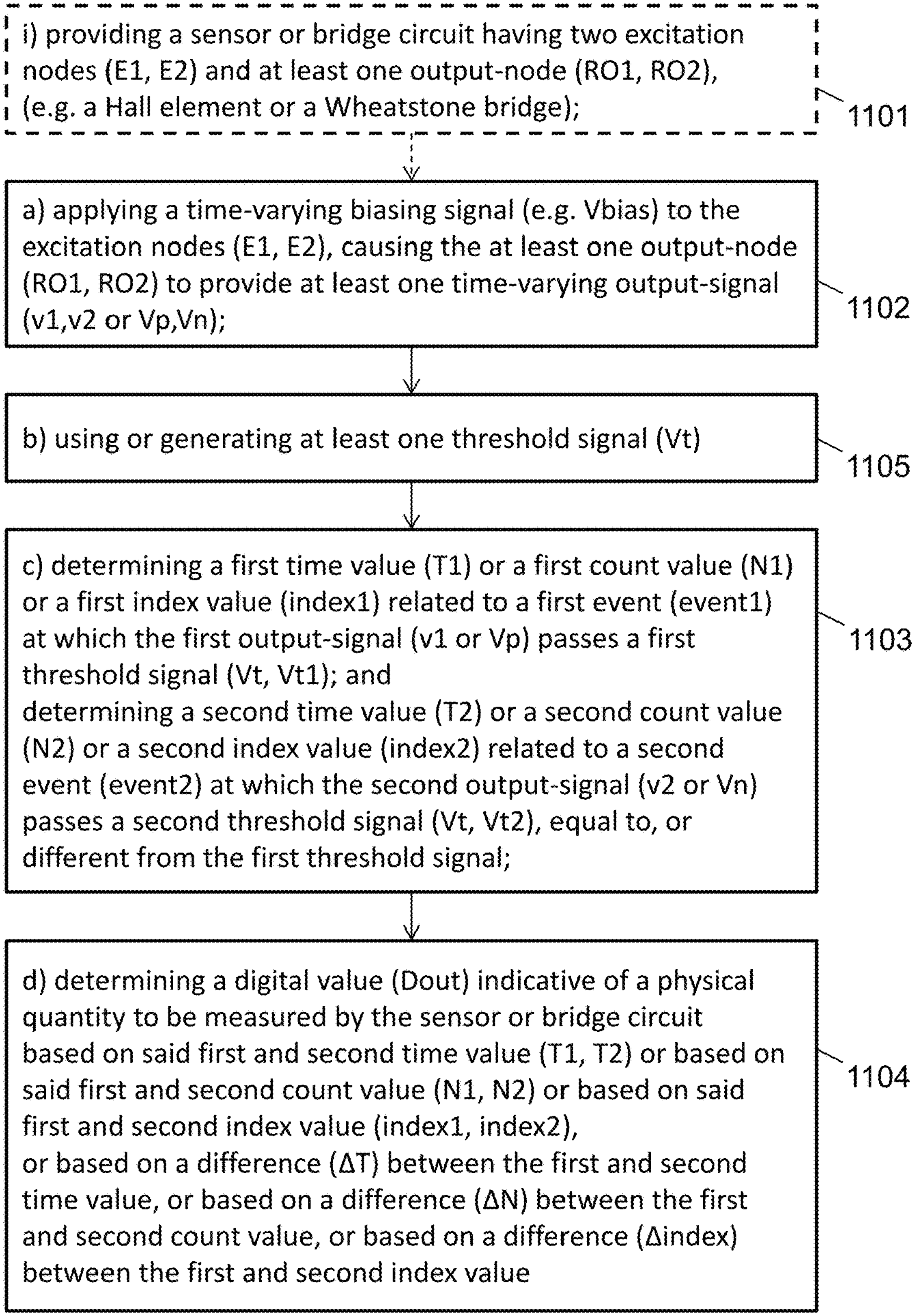

A method of determining a digital value based on these principles is shown in FIG. 11.

Figure 6B:
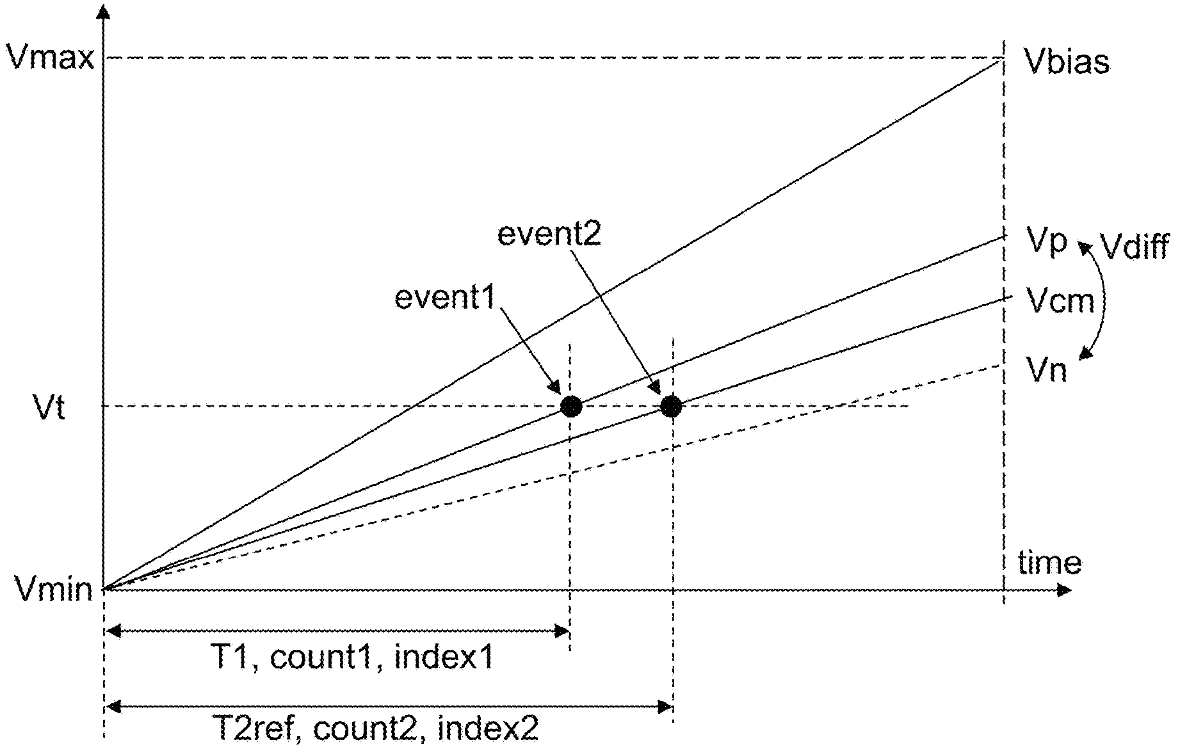

FIG. 6B shows a variant of FIG. 6A, based on the same first and second event as used in FIG. 6A, but wherein the common-mode signal Vcm is actually generated, and where the time T2 or the count value count2 of the second event is actually determined as the moment at which the signal Vcm actually passes the threshold voltage Vt. In preferred embodiments, the second event is detected using a second comparator, having as a reference input the threshold voltage Vt, and having as a signal input the signal Vcm.

The following formulas can be used to determine the value of Dout:

$$Dout=f40(T1,T2,\text{ waveform of biasing signal, }Vt) \quad [40]\text{, or as:}$$

$$Dout=f41(T2-T1,\text{ waveform of biasing signal, }Vt) \quad [41]\text{, or as:}$$

$$Dout=f42(N1,N2,\text{ waveform of biasing signal, }Vt) \quad [42]\text{, or as:}$$

$$Dout=f43(N2-N1,\text{ waveform of biasing signal, }Vt) \quad [43]\text{,}$$

wherein the Vbias waveform may be represented by a set of parameters such as e.g. Vmin, Tstart, Vmax, Tend, or by a set of parameters Vmin, Vmax, slope;

or if the biasing signal is generated using a DAC and an indexed table (e.g. stored in a non-volatile memory):

$$Dout=f44(\text{index1},\text{index2},Vt) \quad [44]\text{, or as:}$$

$$Dout=f45(\text{index2}-\text{index1},\ Vt) \quad [45]$$

In an embodiment where the biasing signal and the threshold signal have a predefined waveform or value, the specific shape of the biasing signal and the threshold signal does not need to be taken into account in the output function, but the digital output value can be determined as:

$$Dout=\text{LookupTable46}[T2-T1] \quad [46], \text{ or as}$$

$$Dout=\text{LookupTable47}[N2-N1] \quad [47], \text{ or as}$$

$$Dout=\text{LookupTable48}[\text{index2}-\text{index1}] \quad [48]$$

It is also possible to express Dout as a polynomial expression of the single value (T2−T1) or of the single value (N2−N1) or of the single value (index2−index1) using a number of coefficients, where the values of the coefficients take into account specifics of the biasing signal and the threshold signal. This can be written as:

$$Dout=\text{Polynomial49}(T2-T1) \quad [49], \text{ or as}$$

$$Dout=\text{Polynomial50}(N2-N1) \quad [50]$$

$$Dout=\text{Polynomial51}(\text{index2}-\text{index1}) \quad [51]$$

It is also possible to express Dout as a polynomial expression of two variables (T1, T2) or (N1, N2) or (Index1, Index2) using a number of coefficients, where the values of the coefficients take into account specifics of the biasing signal and the threshold signal. This can be written as:

$$Dout=\text{Polynomial52}(T1,T2) \quad [52], \text{ or as}$$

$$Dout=\text{Polynomial53}(N1,N2) \quad [53], \text{ or as}$$

$$Dout=\text{Polynomial54}(\text{index1},\text{index2}) \quad [54]$$

Figure 13:
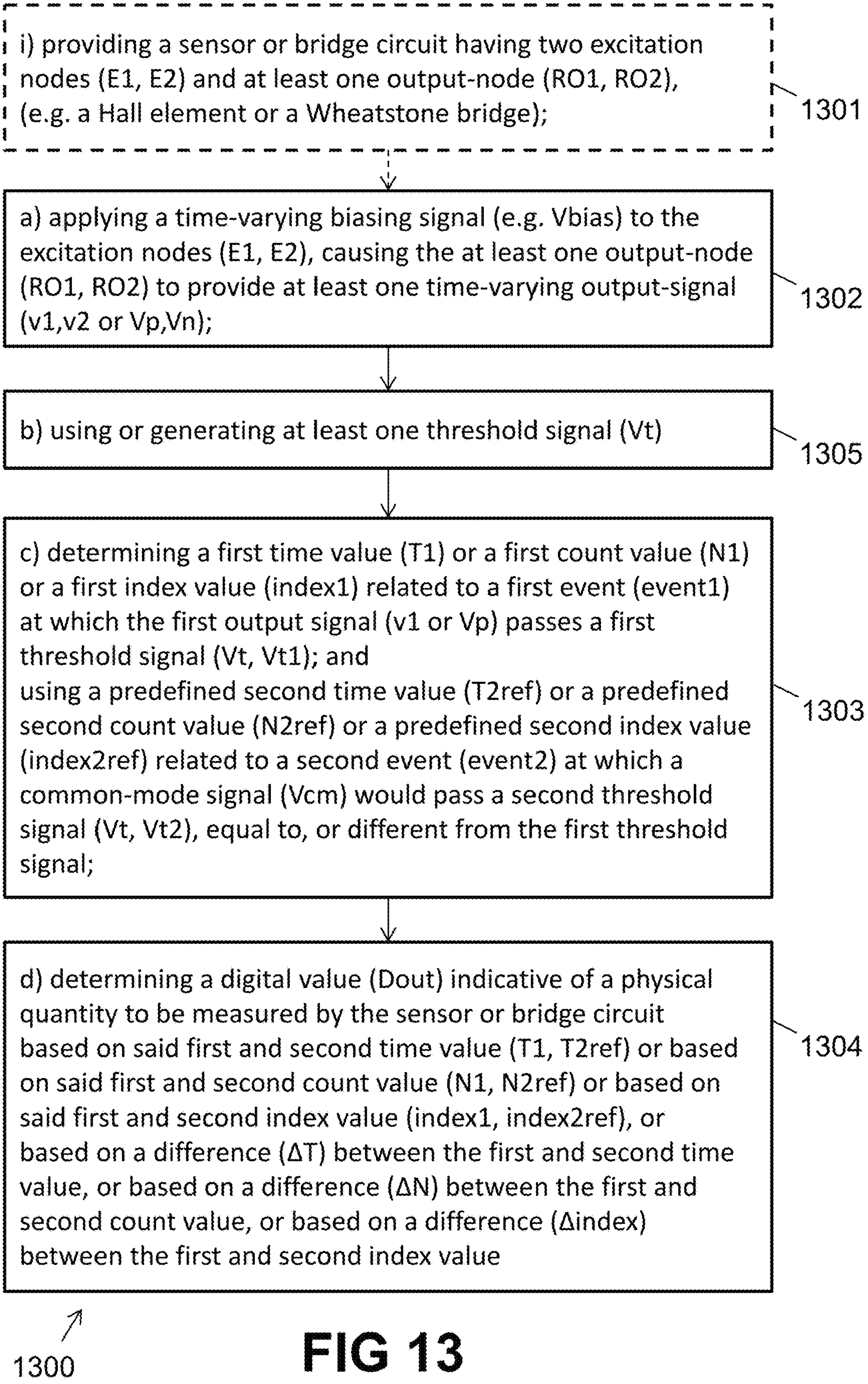

A method of determining a digital value indicative of the physical quantity to be measured, and/or indicative of the differential output signal Vdiff that would occur over the output nodes v1, v2 of the sensor or bridge circuit when the biasing voltage Vbias would reach a predefined value Vmax using these principles, is shown in FIG. 13.

In an embodiment, the signal Vcm is derived from Vp and Vn, e.g. by averaging these signals. The measured time of T2 or count N2 can be compared with a predetermined time or count value, and if the measured time deviates too much, an error can be signalled.

Figure 7:
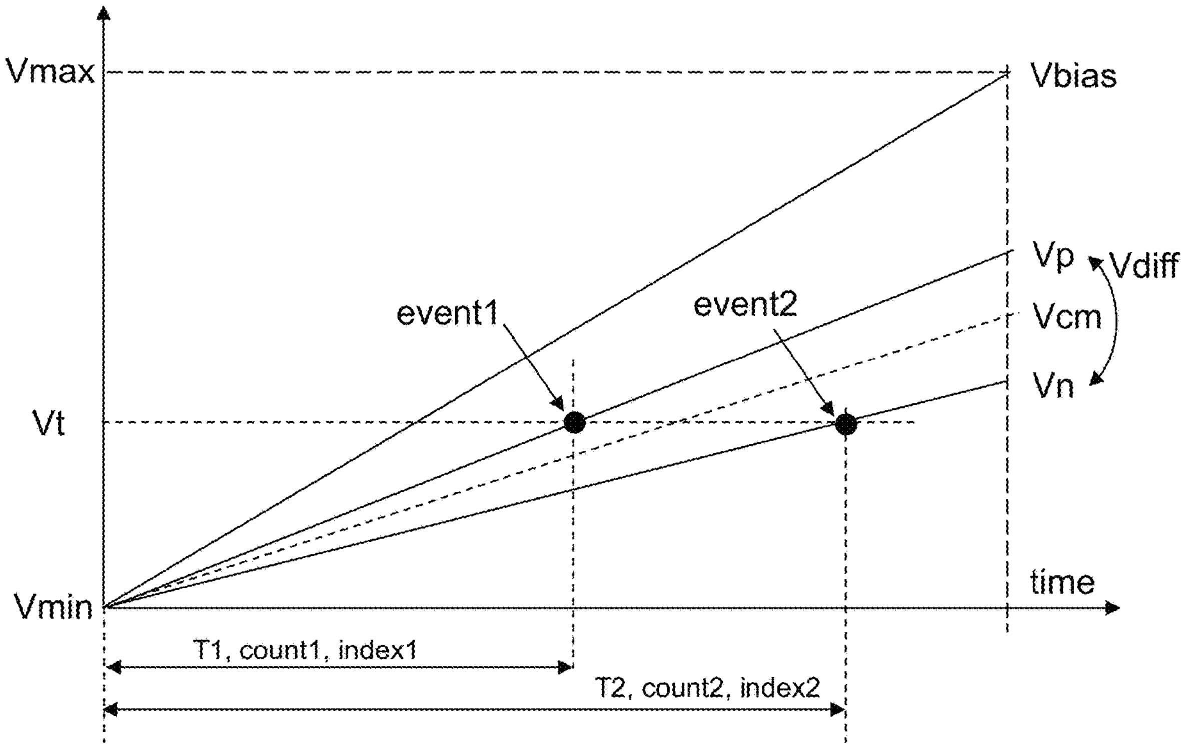

FIG. 7 shows a simple version of FIG. 5, based on a first event event1 related to a first time T1 or a first count value count1 at which one of the output nodes (in the example: Vp) passes the threshold voltage Vt, and based on a second event event2 related to a second time T2 or a second count value count2 at which the other output node (in the example: Vn) passes the same threshold voltage Vt. The first event can for example be detected using a first comparator using Vt as first input and Vp as second input. The second event event2 can for example be detected using a second comparator using Vt as first input and using Vn as second input.

Figure 12:
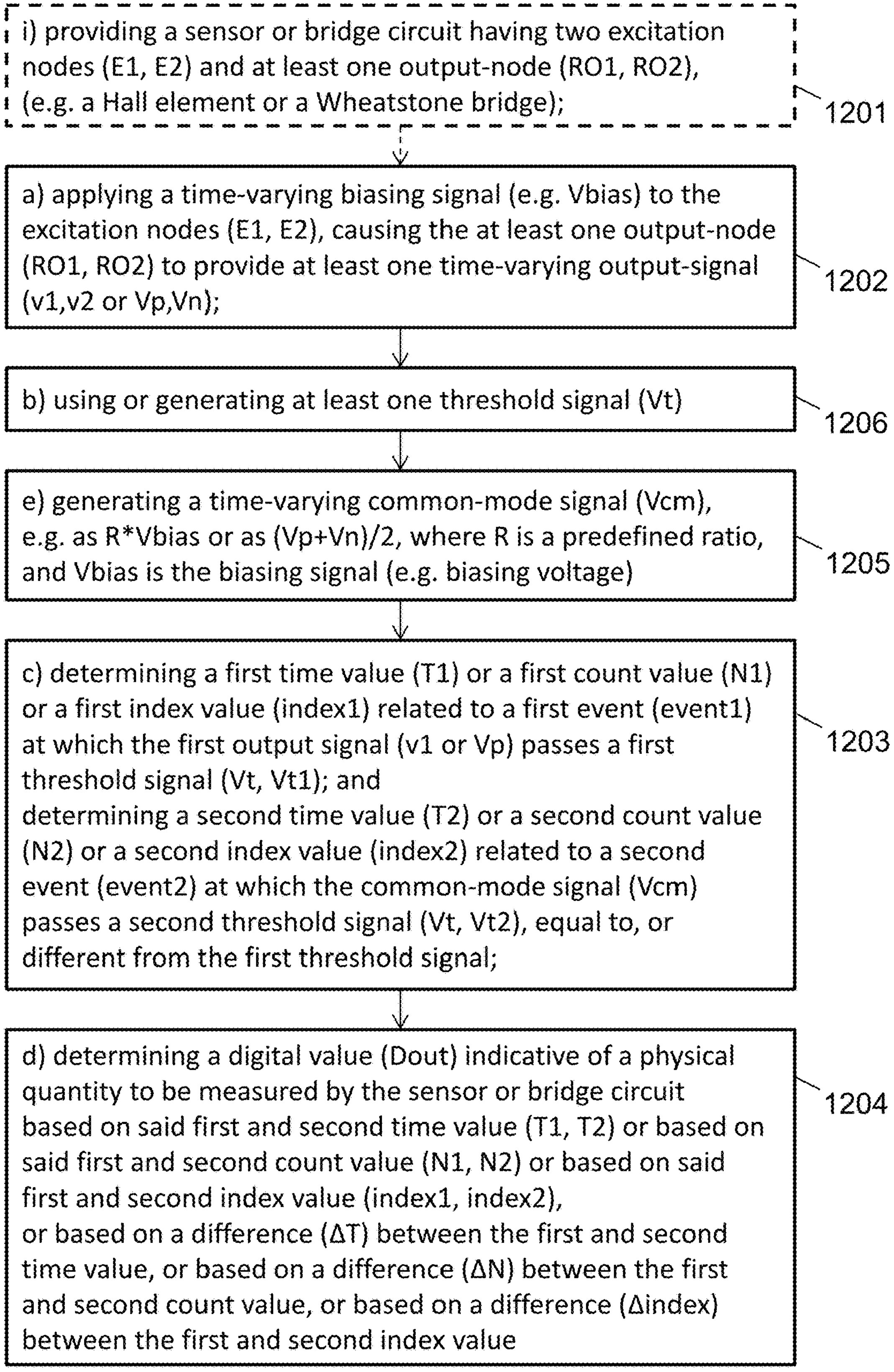

A method of determining a digital value indicative of the physical quantity to be measured, and/or indicative of the differential output signal Vdiff that would occur over the output nodes v1, v2 of the sensor or bridge circuit when the biasing voltage Vbias would be a predefined value Vmax using this principle, is described in FIG. 12.

Figure 8A:
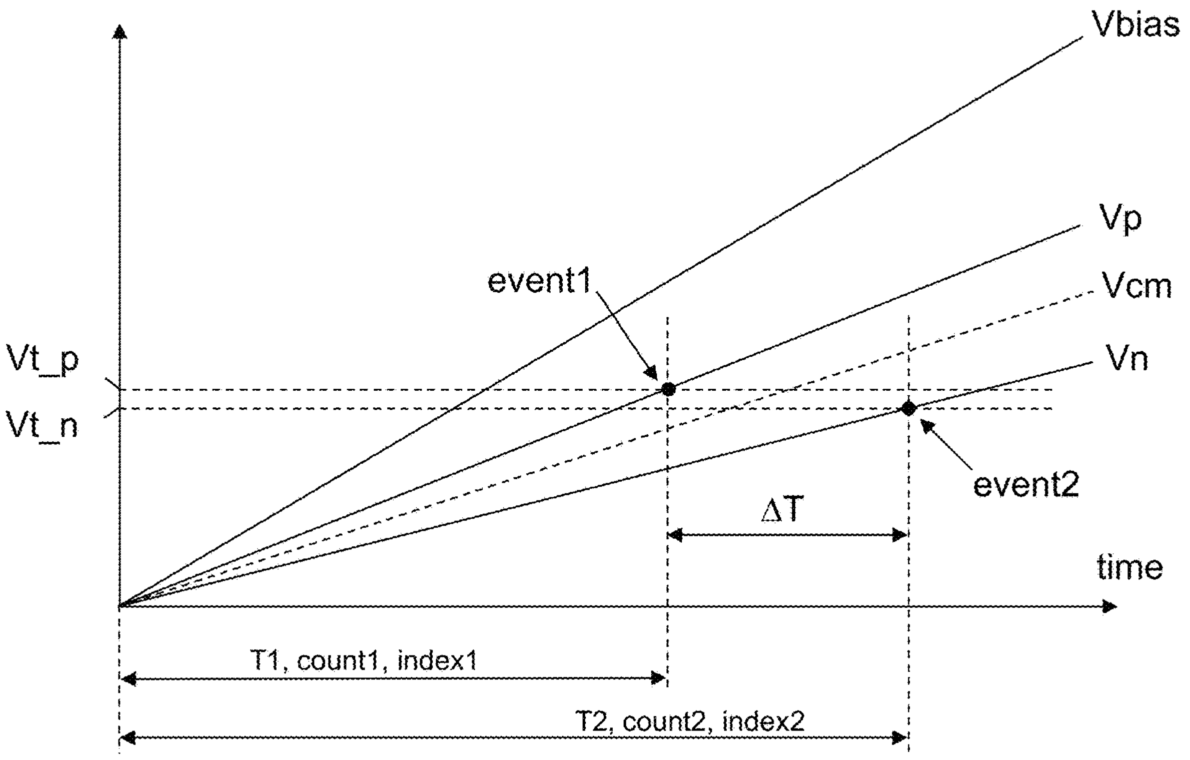

FIG. 8A illustrates another variant of FIG. 5, or a further variant of FIG. 7, where two different threshold signals are used: a first threshold voltage Vt_p and a second threshold voltage Vt_n different from Vt_p. In the example shown in FIG. 8A, Vt_p is higher than Vt_n, but that is not absolutely required. In the example shown, the first event event1 occurs when Vp passes Vt_p, and the second event occurs when Vn passes Vt_n.

The two reference voltages may have predefined (e.g. constant) voltage levels, or may be dynamically determined and set (e.g. at the start of each new time period). In the former case only a single look-up table or polynomial expression is required to determine the digital output value. In the latter case, a plurality of look-up tables or a multi-dimensional look-up table, or a plurality of polynomial expressions, or a polynomial with additional parameters may be required, to take into account which threshold signals were applied during the measurement.

In a variant of FIG. 8A (not shown), which can also be seen as a variant of FIG. 6B, a first event event1 occurs when Vp passes a first threshold voltage Vt1, and a second event occurs when Vem passes a second threshold voltage Vt2, different from Vt1. Similar formulas as mentioned above can be used.

In another variant of FIG. 8A (not shown), which can also be seen as another variant of FIG. 6B, a first event event1 occurs when Vn passes a first threshold voltage Vt1, and a second event occurs when Vem passes a second threshold voltage Vt2, different from Vt1. Similar formulas as mentioned above can be used.

Figure 8B:
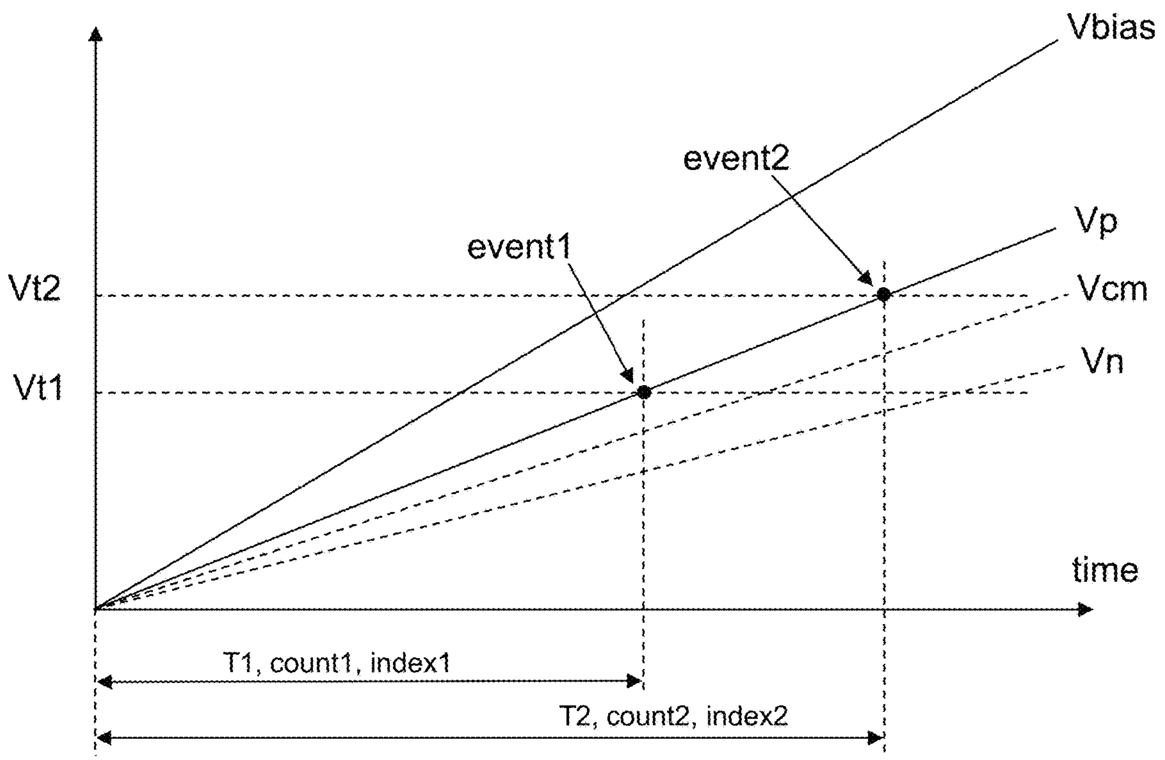

FIG. 8B illustrates another variant of FIG. 5, which can also be considered a further variant of FIG. 8A, where two threshold voltages are used: a first threshold voltage Vt1, and a second threshold voltage Vt2. A first event (event1) is defined as the moment at which one of the signals (e.g. Vp) passes the first threshold Vt1, and a second event (event2) is defined as the moment at which the same signal (e.g. Vp) passes the second threshold Vt2. Using a first look-up table or a first polynomial that takes into account Vbias and the first threshold Vt1, a first value Dout1 for Dout can be determined based on the time T1 or count N1 of the first event. And using a second look-up table or a second polynomial that takes into account the second threshold signal Vt2, a second value Dout2 for Dout can be determined based on the time T2 or the count N2. If the physical quantity did not significantly change between the two events, the value of Dout1 and Dout2 should be approximately the same. In an embodiment, the two values Dout1, Dout2 are averaged to increase the signal-to-noise ratio (SNR) of the measurement. In an embodiment, a consistency of the two values Dout1, Dout2 is tested, and is used as a diagnostic signal to detect an error.

Figure 8C:
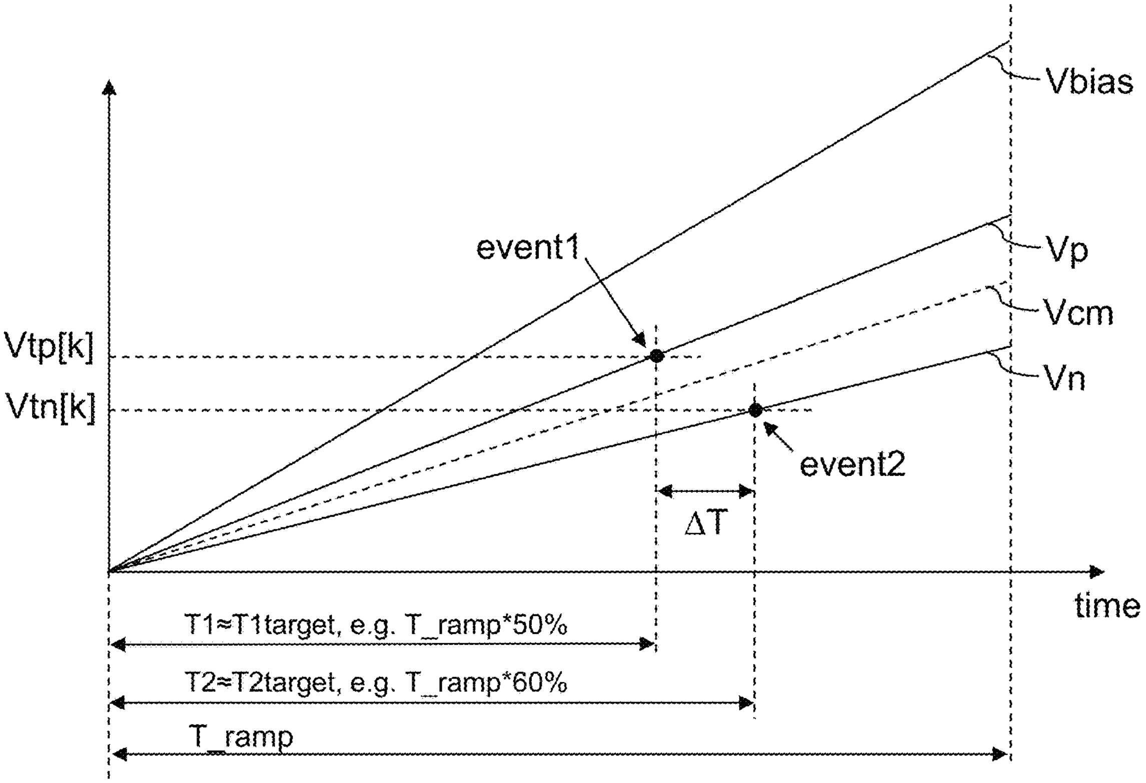

FIG. 8C illustrates a method which can be seen as yet another variant of FIG. 8A, wherein two different threshold signals are used, namely Vtp and Vtn, which are constant during each time-slot, but which are dynamically updated over different time-slots. The first threshold signal Vtp is generated by digitizing a first digital value Val1 and the second threshold signal Vtn is generated by digitizing a second digital value Val2, e.g. by applying the first and second digital value Val1 and Val2 to at least one DAC (digital-to-analog convertor), and optionally using a sample and hold circuit. A first event occurs at a time T1 at which the first signal Vp (t) passes the first threshold signal Vtp, and a second event occurs at a time T2 at which the second signal Vn(t) passes the second threshold signal Vtn. The first and second digital value Val1, Val2 are then updated such that in the next time-slot the value of T1[k+1] will be approximately equal to a first target value T1target, and such that in the next time-slot the value of T2[k+1] will be approximately equal to the a second target value T2target, using a closed loop controller, e.g. using a “PID control-loop”. In FIG. 8C the threshold signals are labelled as Vtp[k] and Vtn[k] to clearly indicate that they are updated in each new timeslot (only one timeslot is shown in FIG. 8C).

In an embodiment, the threshold value Val1 (or Val1[k]) is dynamically updated such that the measured value of T1 or N1, at which Vp(t) crosses Vtp[k], is approximately equal to a first predefined target value T1target or N1target; and the threshold value Val2 (or Val2[k]) is dynamically updated such that the measured value of T2 or N2, at which Vn(t) crosses Vtn[k], is approximately equal to a second predefined target value T2target or N2target, equal to, larger than, or smaller than T1target or N1target.

In the example shown in FIG. 8C, T1target is chosen equal to 50% of the period T_ramp, and T2target is chosen equal to 60% of the period T_ramp, but of course, the present invention is not limited hereto, and other absolute values or relative values (e.g. as percentage of T_ramp) can also be used.

In an embodiment, the threshold values Val1 and Val2 are dynamically adjusted such that the measured (T2−T1)=ΔT is substantially equal to a predefined target value ΔTtarget.

Interestingly, if such a control loop is used, the digital value Dout for the physical quantity to be measured can be determined as a function of the values Val1 and Val2, or as a function of (Val1−Val2), once the control loop is actively tracking (or "locked"). As mentioned above, the predefined function can be implemented as a look-up table or as a polynomial function, the values or coefficients of which can be determined by performing a calibration test, and may be stored in a non-volatile memory, from which they can be retrieved during actual use of the sensor device.

Figure 8D:
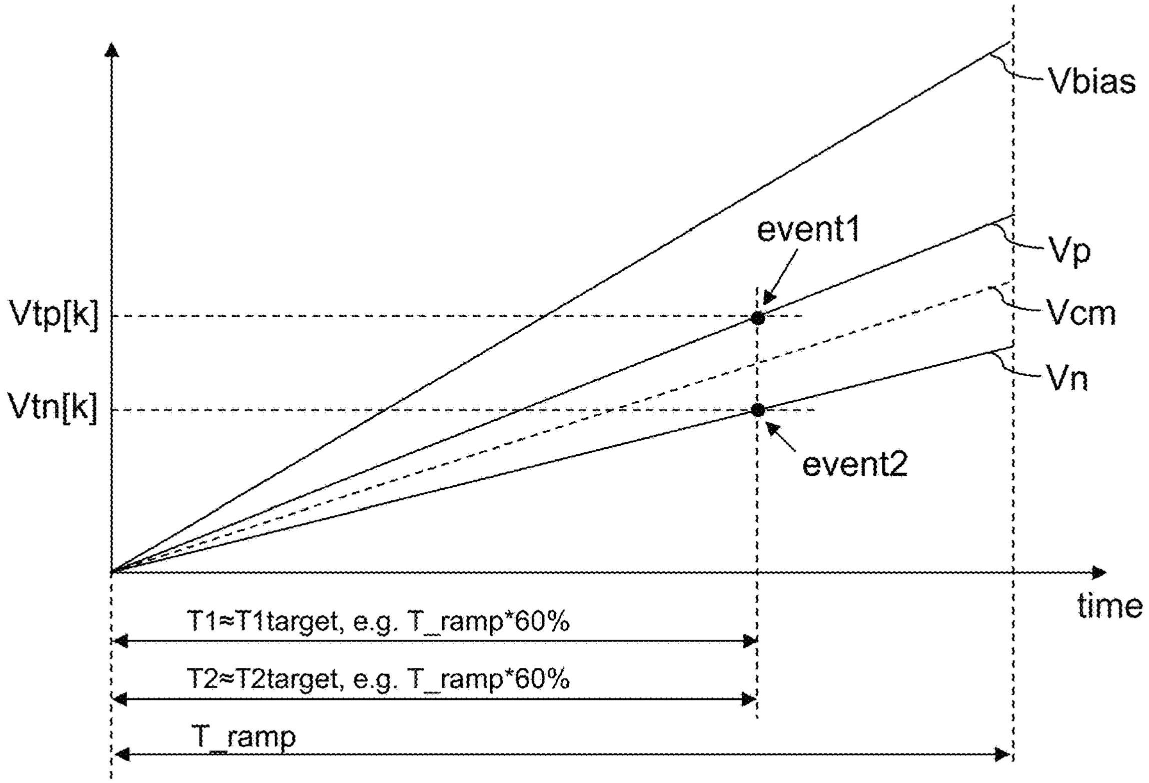

FIG. 8D shows a special case of FIG. 8C where the control loop is configured for dynamically updating the threshold values Val1, Val2 such that the first event and the second event substantially coincide.

For sensors circuits having two output signals Vp and Vn, the digital value of the physical quantity to be measured can be determined as a function of (Val1−Val2).

For sensors circuits having two output signals Vp and Vn which have a predefined relation with respect to each other (as is the case e.g. for Hall elements and a Wheatstone bridge with MR elements), the digital value of the physical quantity to be measured can also be determined as a function of only Val1, or as a function of only Val2 (because their average is substantially equal to the value of the common mode signal Vcm at time T1target). This is also true if T1target is not equal to T2target (e.g. as illustrated in FIG. 8C).

In the specific example shown in FIG. 8D, the value of T1target=T2target is chosen equal to Tramp*60%, but of course, another value can also be used.

It is noted that the method with the "control loop" also works for sensor circuits having only one one output signal Vp. In this case, the control loop will be configured to dynamically adjust the threshold value Vt such that the time T1 or count N1 of the first event occurs at a predefined moment in time T1target. And the digital value Dout of the physical quantity to be measured can also be derived solely from the (dynamically adjusted) value Val1 corresponding to the threshold signal Vt, e.g. using a look-up table or a polynomial function, having values or coefficients which are determined during a calibration, and which are stored in a non-volatile memory, as described above.

Preferably a single predefined waveform of the biasing signal is used, but the present invention is not limited hereto. If there are multiple predefined waveforms of the biasing signal possible, then for each of these biasing signals a look-up table or polynomial expression can be determined (e.g. by simulation or by calibration) that codifies the correspondence between the threshold value Val1 and the quantity to the measured, and during actual use of the device, the appropriate table or polynomial needs to be selected, e.g. using an additional parameter indicating which predefined biasing signal is used.

The embodiments with a tracking loop, e.g. as illustrated in FIG. 8C and FIG. 8D, may work particularly well to measure physical quantities that can change only slowly.

Figure 9:
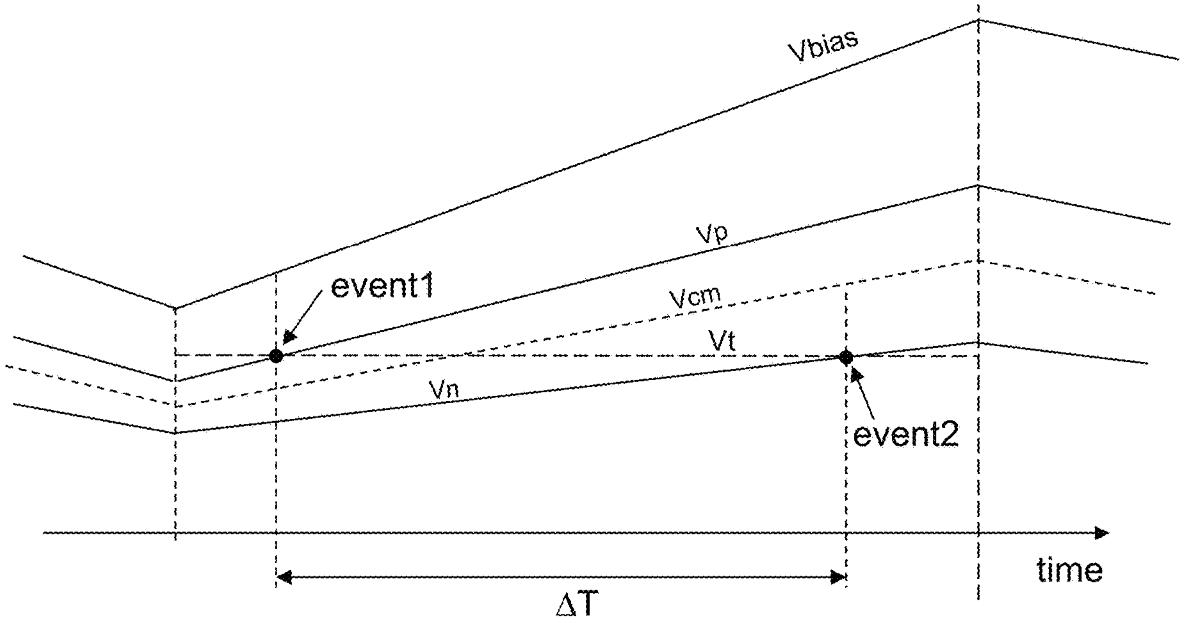

FIG. 9 illustrates another variant of FIG. 5, where the biasing signal, e.g. biasing voltage does not linearly increase from zero to a predefined maximum voltage level in each period, but linearly increases from a first voltage level to a second voltage level during even numbered time slots, and linearly decreases from the second voltage level to the first voltage level during odd-numbered time slots (only partially shown).

In a variant of FIG. 9 (not shown), the value of the first voltage level and/or the value of the second voltage level and/or the slope of the biasing voltage are not fixed, but are dynamically adjusted in each timeslot, e.g. depending on the measured timer or counter event(s).

In another or a further variant of FIG. 9 (not shown), two different threshold voltages are used instead of one.

In another or further variant of FIG. 9, the first event is determined when one of the output voltages crosses a threshold voltage Vt, and the second event is determined when the common mode voltage Vcm crosses the (or a second) threshold voltage. As mentioned above (see e.g. FIG. 6A) it is not absolutely required that the common-mode voltage is actually available, and instead of measuring when the common mode voltage passes a certain threshold voltage, this time may also be dynamically calculated, or determined using a look-up table, or the like.

In all of the embodiments illustrated in FIG. 5 to FIG. 9, it was assumed that a periodic measurement is performed during subsequent time slot having a predefined duration (e.g. T_ramp), and that the physical quantity to be measured does not significantly change during that time duration.

Figure 18:
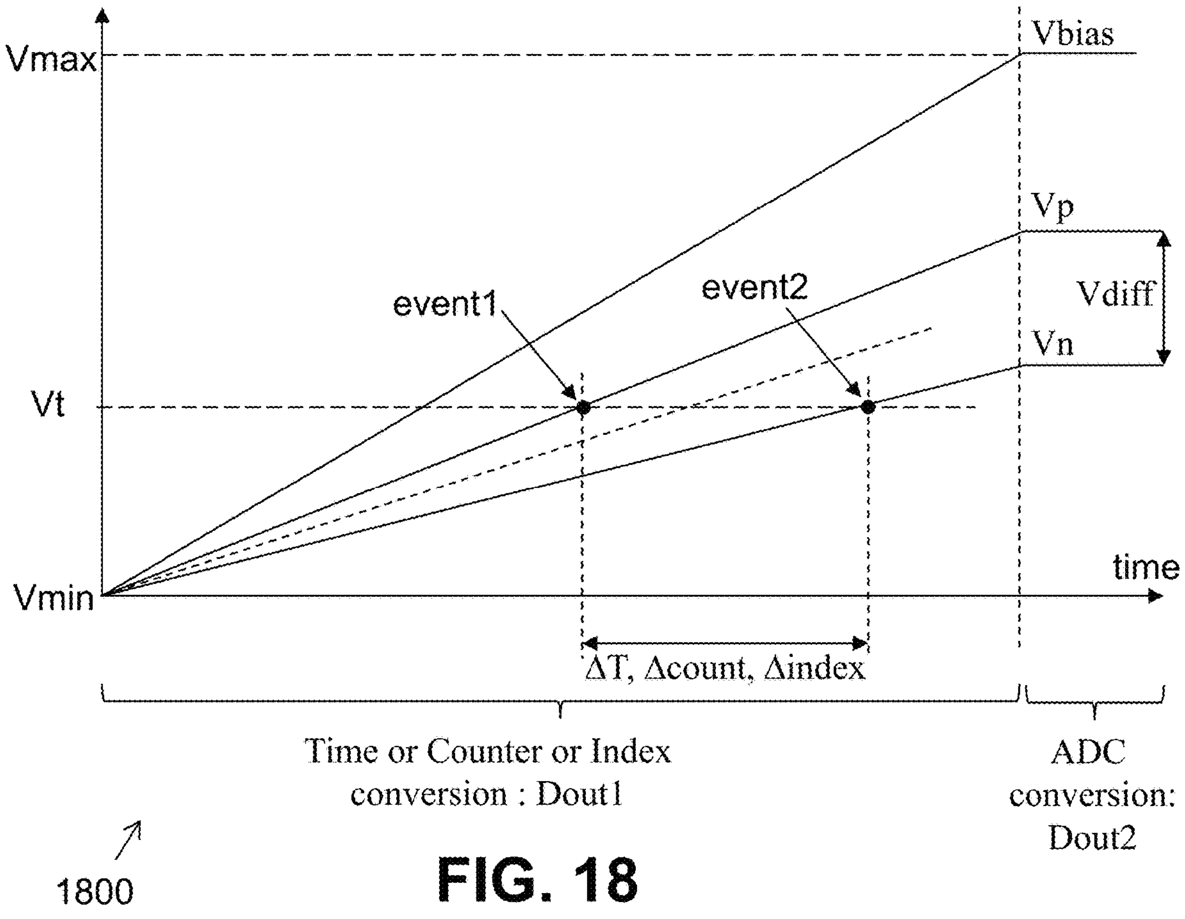
FIG. 18 shows an illustrative example of a graph showing a digitization scheme having two portions, as may be used by the method of FIG. 14 and/or by the circuit of FIG. 17.

In FIG. 18, an embodiment will be shown where each time slot comprises two portions, including a first portion wherein a first digital value Dout1 for the physical quantity (e.g. magnetic field value, or pressure value) is determined based on one or more time values or count values or threshold values, e.g. as discussed above when discussing FIG. 5 to FIG. 9; and including a second portion wherein a second digital value Dout2 for the physical quantity is determined using a classical ADC circuit. Of course, it is also possible to first determine a digital value using the ADC circuit, and then determine another digital value based on timing or counter information.

FIG. 10 shows a flow-chart of a method 1000 of providing a digital value (Dout) indicative of a physical quantity to be measured by a sensor circuit or a bridge circuit that has two excitation nodes (E1, E2) and at least one readout node (RO1, RO2), e.g. two readout nodes, the method comprising the steps of:

a) applying (1002) a time-varying biasing signal (e.g. Vbias) directly or indirectly to the excitation nodes (E1, E2) of the sensor or bridge circuit, causing the at least one output-node (RO1, RO2) to provide at least one time-varying output-signal (v1, v2 or Vp, Vn);
b) determining (1003) at least one time value (T1) or at least one count value (N1) or at least one index value (index1) related to a first event (event1) at which the at least one output-signal (Vp) passes at least one threshold signal (Vt);
c) determining (1004) a digital value (Dout) indicative of the physical quantity to be measured based on said at least one time value (T1) or said at least one count value (N1) or said at least one index value (index1).

An underlying principle of the present invention is to convert timing information (or counter information, or index information) into a digital value. This timing information or counter information or index information is related to a magnitude of the physical quantity to be measured.

The method may further comprise a step of: i) providing a sensor or bridge circuit having two excitation nodes (E1, E2) and at least one output node (RO1, RO2), such as e.g. a Hall element, a horizontal Hall element, a vertical Hall element, or a Wheatstone bridge, or a resistor circuit comprising one or more legs, each leg comprising two or more resistors (e.g. piezo-resistors, magneto-resistors, XMR, TMR, AMR, GMR resistors).

The method may further comprise providing one or more of the following: a timer, a counter operating at a predefined clock frequency (fCLK), a biasing circuit, one comparator or two comparators or more than two comparators, an analog-to-digital convertor (ADC), a digital-to-analog convertor (DAC), a PWM circuit (pulse-width-modulation) optionally followed by a low-pass filter, etc.

The method may also comprise the steps of providing at least one comparator, e.g. one comparator or two comparators; and providing at least one threshold voltage (Vt) to a first input of the at least one comparator; and providing at least one readout voltage (e.g. v1 or v2) to a second input of the at least one comparator. In such an embodiment, the first event can be detected e.g. by monitoring when an output level of the comparator changes state. The latter may be implemented e.g. using a polling technique or can be implemented efficiently using an interrupt of a digital processor.

The method may also comprise the steps of: providing at least one analog-to-digital convertor (ADC); and step a) may further comprise: repeatedly digitizing said at least one output voltage or a differential voltage formed by both output voltages using said ADC; and step b) may further comprise: repeatedly comparing said plurality of digital values with at least one threshold value (e.g. by comparison means, e.g. by a programmable controller).

The method may comprise a further step to convert the digital value Dout into a current value, a torque value, a linear or angular position value, or another physical quantity, for example using a look-up table, or using mathematical formulas, or a combination of these.

In certain embodiments of the method 1000 of FIG. 10, step b) comprises: determining only one time value or only one count value (e.g. T1 or T2, or N1 or N2, or index1 or index2); and step c) comprises: determining Dout based on this single time value or based on this single count value.

FIG. 11 shows a variant of the method of FIG. 10, wherein step b) comprises: determining (1103) a first time value (T1) or a first count value (N1) or a first index value (index1) related to a first event (event1) at which the first output-signal (Vp) passes a first threshold signal (Vt, Vt1); and determining a second time value (T2) or a second count value (N2) or a second index value (index2) related to a second event (event2) at which the second output-signal (Vn) passes a second threshold signal (Vt, Vt2), equal to, or different from the first threshold signal (e.g. as illustrated in FIG. 5 or FIG. 7 or FIG. 8A);

and wherein step c) comprises: determining (1104) a digital value (Dout) indicative of a physical quantity to be measured by the sensor or bridge circuit based on said first and second time value (T1, T2) or based on said first and second count value (N1, N2) or based on said first and second index value (index1, index2), or based on a difference (ΔT) between the first and second time value, or based on a difference (ΔN) between the first and second count value, or based on a difference (Δindex) between the first and second index value.

The detection of the first event may be performed using a first comparator, where the first threshold voltage (Vt1) is applied to a first input of the first comparator, and the first output voltage (Vp) is applied to the second input of the first comparator, and the detection of the second event may be performed using a second comparator, where the second threshold voltage (Vt2) is applied to a first input of the second comparator, and the second output voltage (Vp) is applied to the second input of the second comparator.

FIG. 12 shows another variant of the method of FIG. 10, further comprising step d) of generating (1205) a time-varying common-mode signal (Vcm), e.g. as R*Vbias or as (Vp+Vn)/2, where R is a predefined ratio, and Vbias is the biasing signal (e.g. biasing voltage);

and wherein step b) comprises: determining (1203) a first time value (T1) or a first count value (N1) or a first index value (index1) related to a first event (event1) at which the first output signal (v1 or Vp) passes a first threshold signal (Vt, Vt1); and determining a second time value (T2) or a second count value (N2) or a second index value (index2) related to a second event (event2) at which the common-mode signal (Vcm) passes a second threshold signal (Vt, Vt2), equal to, or different from the first threshold signal;

and wherein step c) comprises: determining (1204) a digital value (Dout) indicative of a physical quantity to be measured by the sensor or bridge circuit based on said first and second time value (T1, T2) or based on said first and second count value (N1, N2) or based on said first and second index value (index1, index2), or based on a difference (ΔT) between the first and second time value, or based on a difference (ΔN) between the first and second count value, or based on a difference (Δindex) between the first and second index value.

An example of this method is illustrated in FIG. 6B.

As already mentioned above, the time value T2 or the count value N2 related to this second event when Vcm crosses the threshold signal is in fact already known beforehand (for a given waveform of the biasing signal and a given threshold signal), and hence measuring this value is not really required, but when measured, it can e.g. be used for error detection.

FIG. 13 shows a variant of the method of FIG. 12, where the value of the second event (at which the common mode signal Vcm crosses the second threshold) is not actually measured, but a reference time value (T_ref) or a reference count value (Nref) is used instead. The method 1300 has the following steps:

a) applying 1302 a time-varying biasing signal (e.g. Vbias) to the excitation nodes (E1, E2), causing the at least one output-node (RO1, RO2) to provide at least one time-varying output-signal (v1,v2 or Vp,Vn);

b) determining 1303 a first time value (T1) or a first count value (N1) or a first index value (index1) related to a first event (event1) at which the first output signal (v1 or Vp) passes a first threshold signal (Vt, Vt1); and using a predefined second time value (T2ref) or a predefined second count value (N2ref) or a predefined second index value (index2ref) related to a second event (event2) at which the common-mode signal (Vcm) would pass a second threshold signal (Vt, Vt2), equal to, or different from the first threshold signal;

c) determining 1304 a digital value (Dout) indicative of a physical quantity to be measured by the sensor or bridge circuit based on said first and second time value (T1, T2ref) or based on said first and second count value (N1, N2ref) or based on said first and second index value (index1, index2ref), or based on a difference (ΔT) between the first and second time value, or based on a difference (ΔN) between the first and second count value, or based on a difference (Δindex) between the first and second index value.

An example of this embodiment wherein the second threshold signal Vt2 is equal to the first threshold signal Vt1, is illustrated in FIG. 6A.

Figure 14:
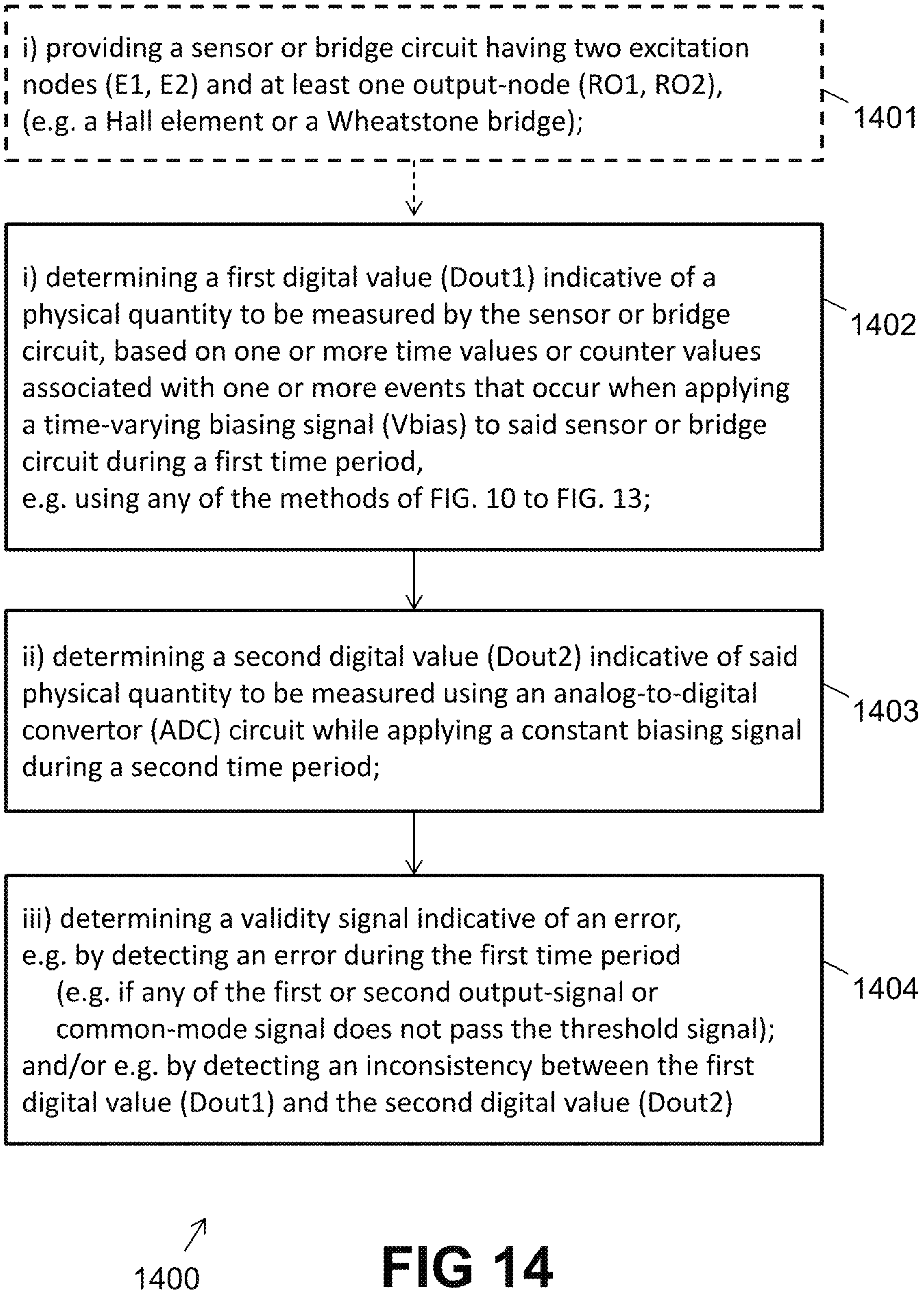

FIG. 14 shows a flow-chart of a method 1400 of determining in a reliable manner a digital value indicative of a physical quantity to be measured by a sensor or a bridge circuit that has two excitation nodes (E1, E2) and at least one output node, e.g. two output nodes (RO1, RO2);

wherein the method comprises the steps of:

i) determining a first digital value Dout1 indicative of the physical quantity to be measured based on one or more of said time values or counter values associated with the one or more events that occur when applying a time-varying biasing signal (Vbias) to said sensor or bridge circuit during a first time period; e.g. using any of the methods of FIG. 10 to FIG. 13;

ii) determining a second digital value Dout2 indicative of said physical quantity to be measured using an analog-to-digital convertor (ADC) circuit, e.g. a classical ADC circuit, while applying a constant biasing signal (e.g. constant biasing voltage or constant biasing current) during a second time period;

iii) determining a validity signal indicative of an error.

Step iii) may comprise: detecting an error during the first time period, e.g. by detecting that one or more of the first output signal (e.g. Vp), the second output signal (e.g. Vn), the common-mode signal (e.g. Vcm, if generated) does not pass the threshold signal (e.g. Vt). Alternatively or additionally, step iii) may comprise: detecting an inconsistency between the first digital value (Dout1) and the second digital value (Dout2), e.g. using a predefined criterion which may depend e.g. on the resolution of the ADC, the accuracy of the timing circuit, etc.

In an embodiment, the three steps i) to iii) of the method 1400 are performed by a sensor device 1730 comprising said sensor or bridge circuit 1740. In this case, the sensor device 1730 may output a digital value (e.g. one of the digital values Dout1, Dout2, or an average of the two values, or a weighted average of the two values) as an indication of the physical quantity to be measured, and/or may output a validity signal indicative of an error being detected.

In an embodiment, the steps i) and ii) are performed by a sensor device 1730 comprising said sensor or bridge circuit 1740, and step iii) is performed by an external processor (not shown), outside of the sensor device. In this case, the sensor device would output the two digital values Dout1, Dout2, and the external processor would perform a consistency check of these values. An outcome of this consistency check can then be used as a validity signal.

Figure 15:
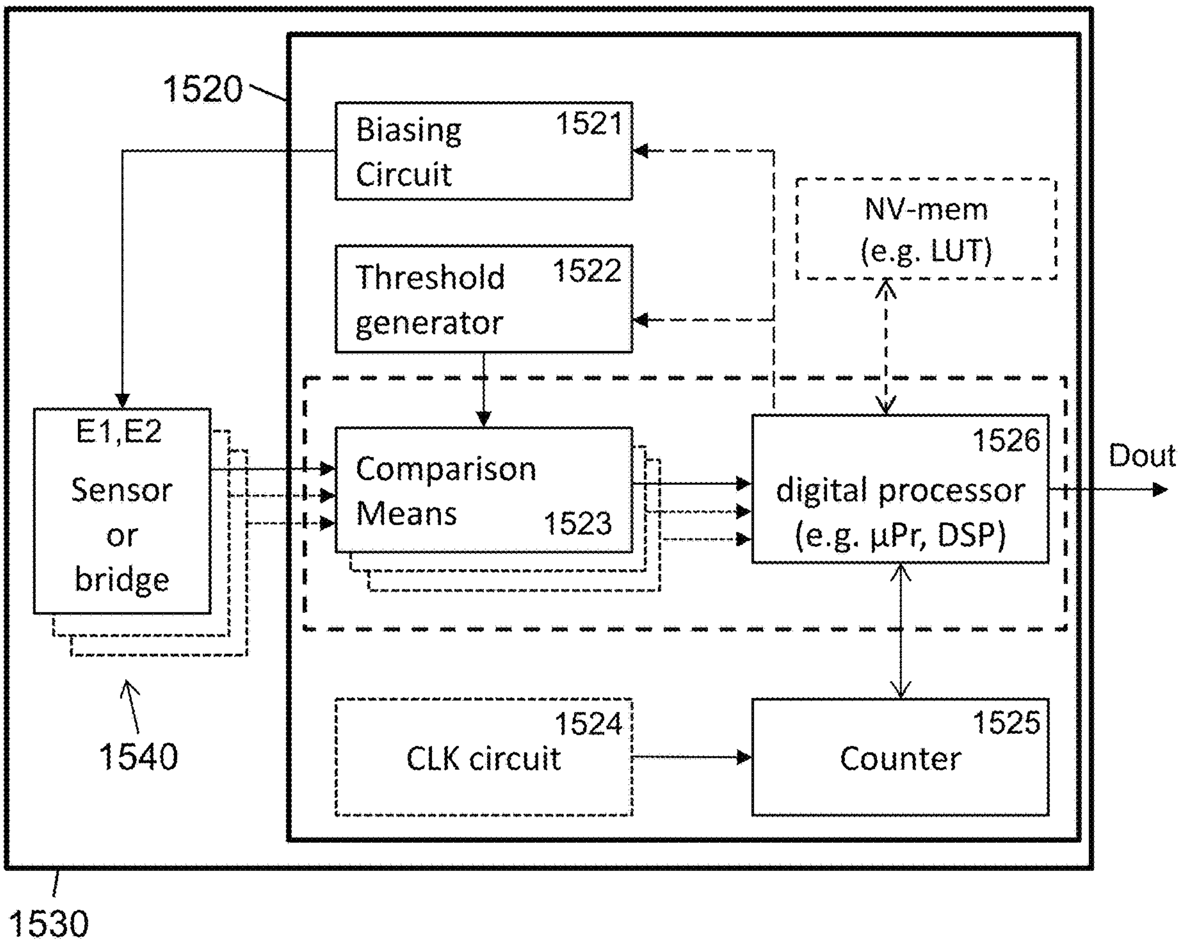
FIG. 15 to FIG. 17 show high-level block diagrams of circuits and devices proposed by the present invention.
Figure 16:
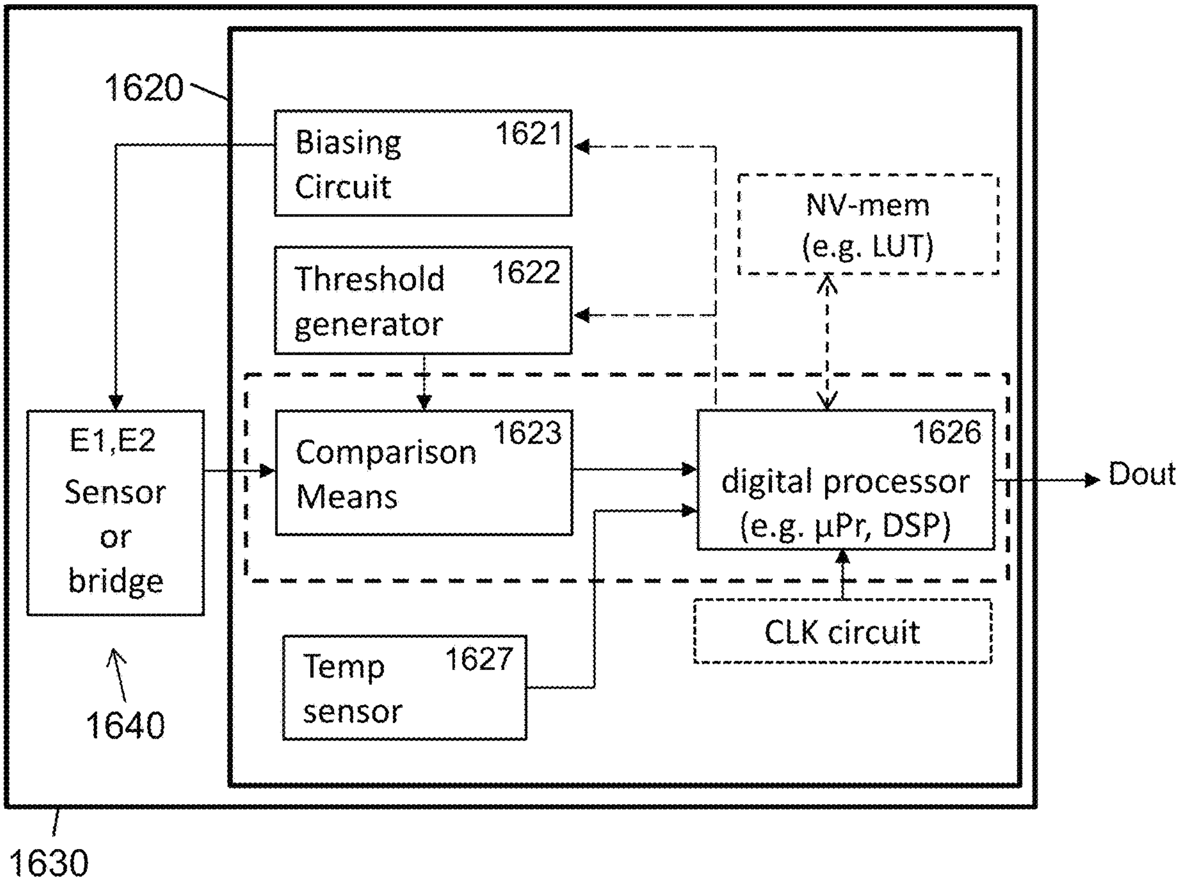
Figure 17:
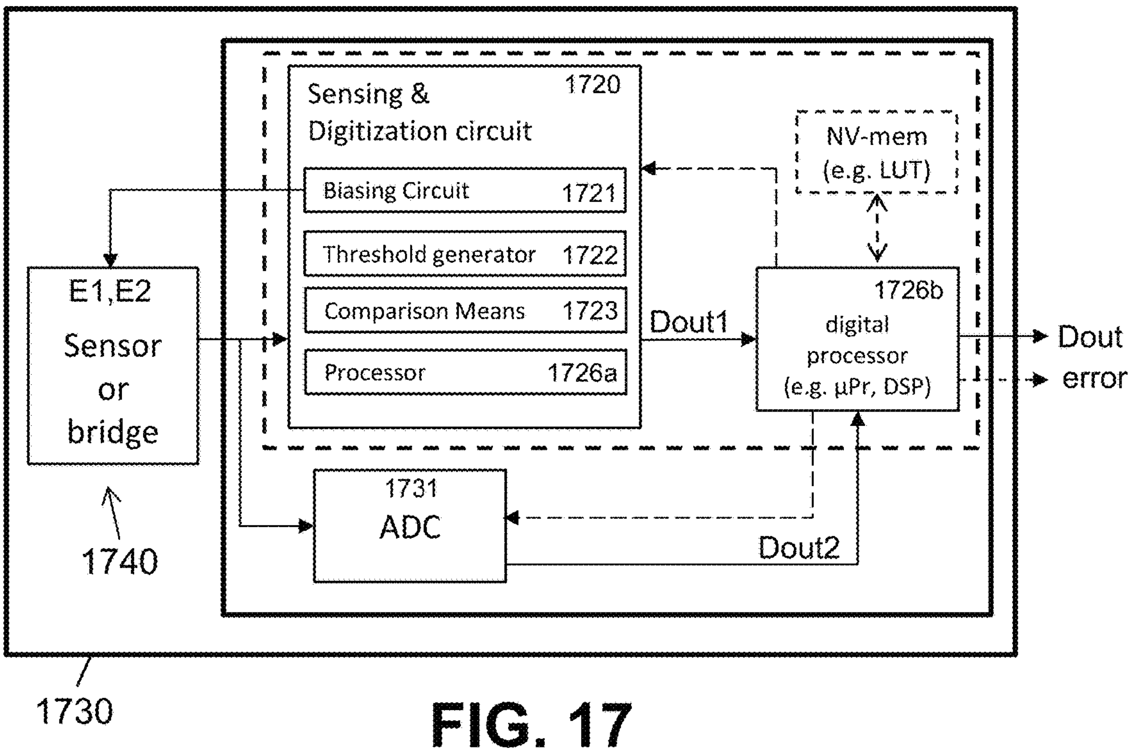

FIG. 15 to FIG. 17 show high-level block diagrams of circuits 1520, 1620, 1720 and integrated sensor devices 1530, 1630, 1730 for determining a digital value "Dout" indicative of a physical quantity to be measured by a sensor or a bridge circuit 1540, 1640, 1740 that has two excitation nodes E1, E2 and at least one output-node RO1, RO2, such as e.g. a Hall element, or a Wheatstone bridge, or a resistor network comprising at least two resistors in series, or a value derived from said digital value (e.g. a linear or angular position, a current value, a torque value).

FIG. 15 shows an illustrative example of an integrated sensor device 1530 comprising at least one such sensor or bridge circuit, and a circuit 1520 operatively connected to said at least one sensor or bridge circuit 1540 and configured for determining at least one digital value Dout indicative of said physical quantity to be measured, e.g. by performing a method as illustrated in any of FIG. 10 to FIG. 14. The circuit 1520 may be referred to as "sensing and digitization circuit", and comprises:

a biasing circuit 1521 configured to generating and applying a time-varying biasing signal (e.g. Vbias) to the excitation nodes E1, E2 of the at least one sensor or bridge;

a threshold generator 1522 configured to generate at least one threshold signal or value (e.g. an analog threshold voltage or a digital threshold value);

comparison means 1523 configured to detect at least a first event event1, at which at least one read out signal (e.g. v1 or v2 or Vp or Vn) or a signal or value derived therefrom passes at least one threshold signal (e.g. threshold voltage Vt) or threshold value. As mentioned above, the comparison can be performed in the analog domain, or in the digital domain. In the latter case, the at least one readout signal from the at least one sensor is first digitized by an ADC (not shown).

a timer (not shown) or a counter 1525. The counter may be configured to operate at a predefined clock frequency. The clock signal may be generated inside the integrated sensor device in known manners (e.g. using an RC oscillator, or a crystal oscillator circuit), or may be provided to a clock-pin of the integrated sensor device, etc.

a digital processor 1526, e.g. a programmable microcontroller or a digital signal processor (DSP). This processor may be configured with executable instructions to perform at least step b) and step c) of the method illustrated in any of FIG. 10 to FIG. 14. When use is made of a predefined (or reference) time value or a predefined (or reference) count value or a predefined (or reference) index value, this time value or count value may be hardcoded, or stored in a non-volatile memory connected to or incorporated inside the digital processor. When use is made of a polynomial expression, the coefficients of that polynomial can be stored in this non-volatile memory. When the biasing signal is generated using a table (also referred to as LUT, "Look-Up Table") and an index, the values of this table can also be stored in this non-volatile memory.

While not explicitly shown, the sensor device may also contain at least one amplifier, e.g. a differential amplifier configured for amplifying a differential voltage over the output nodes of the sensor or bridge circuit.

The "comparison means" may include one or more "comparators" (e.g. in case the comparison is performed in the analog domain), or the comparison may be performed in software, e.g. as an executable instruction performed by the digital processor 1526. As an example, if the detection of event1 and/or event2 is performed in the analog domain, a single comparator per sensor (or per bridge) may be sufficient to perform the method of FIG. 10 or FIG. 13, but two comparators per sensor (or per bridge) would be needed in order to perform the method of FIG. 11 or FIG. 12 or FIG. 14. If the detection of event1 and/or event2 is performed in the digital domain, no (analog) comparators are required, but the comparison would be performed by the digital processor, as graphically indicated by the dotted rectangle surrounding the comparison means and the digital processor.

In case one or more analog comparators are used, an output of the/each comparator may be connected to a/separate input(s) of the processor 1526, and the processor may be configured to generate an interrupt when one of these inputs changes state (e.g. rising and/or falling edge, depending on the implementation), and the processor may have an interrupt service routine to determine and further process (e.g. temporarily store) a timer value or count value.

In case of multiple sensors (or bridge circuits) and in case the detection of the event(s) is performed in the analog domain using analog comparators, each of the sensors (or bridges) may provide one or two or more output signals to a corresponding comparator or to a corresponding set of two comparators. (more than two output signals may be provided e.g. in case of a sensor structure as illustrated in FIG. 2B, and/or in case a common-mode signal Vcm is provided).

It is an advantage that a single processor with for example four inputs can easily determine four different time values or four different count values indicative of four physical quantities (e.g. four magnetic field components) measured by four Hall elements, in a single time period (e.g. having a time duration T_ramp as illustrated in FIG. 5).

Many variants of the circuit 1520 shown in FIG. 15 may be possible. For example:

- the timer or counter may be a hardware component located outside of the digital processor, or may be incorporated inside the digital processor;
- the biasing circuit 1521 may be configured to generate for example a linearly increasing voltage signal Vbias ranging from a first voltage value to a second voltage value. Suitable circuits for generating a linearly increasing ramp are known in the art, and hence do not need to be described in full detail here. It suffices to say that such circuits may comprise an operational amplifier with a feedback loop. The biasing circuit may be controlled (e.g. started, stopped, reset) by the digital processor;
- the biasing voltage may start from zero and linearly increase to a value Vmax (e.g. as illustrated in FIG. 5), but that is not absolutely required, and the biasing circuit may be configured to start from a non-zero value, and increase to a value different from Vmax. It is also possible to generate a linearly increasing biasing voltage during even numbered time slots, and to generate a linearly decreasing biasing voltage during odd-numbered time slots (e.g. as illustrated in FIG. 9). It is also possible to dynamically change the duration of the ramp (i.e. the duration of the time slots), and/or to dynamically change the slope of the biasing voltage, etc.
- the biasing circuit may also be configured to generate non-linear signals, for example an exponential signal, or a sinusoidal signal. An exponential signal may for example be generated by applying a step function to an RC-circuit.

In a variant of FIG. 15, the circuit 1520 further comprises a digital-to-analog convertor (DAC), and the processor 1526 is configured for generating the time-varying biasing signal using said DAC. The biasing circuit may further comprise a filter for filtering the signal generated by the DAC signal, e.g. a low-pass filter.

The integrated sensor device 1530 may be implemented on a single semiconductor substrate comprising (inter alia) the at least one sensor or bridge circuit and the digital processor 1526, but that is not absolutely required, and in another embodiment, the at least one sensor or bridge circuit 1540 is/are implemented on a first semiconductor substrate, and the digital processor 1526 is implemented on a second semiconductor substrate, and the first and second semiconductor substrate are interconnected and embedded in a single packaged device.

FIG. 16 shows an illustrative example of an integrated sensor device 1630 comprising one or more sensor or bridge circuits 1640 (only one is shown in FIG. 16), and a sense and digitization circuit 1620. The sense and digitization circuit 1620 and the sensor device 1630 can be seen as a variant of the circuit 1520 and the device 1530 of FIG. 15, but furthermore comprising a temperature sensor 1627. This temperature sensor may be configured for measuring a temperature of the single semiconductor substrate that comprises the at least one sensor 1640 and the processor 1626, or may be configured to measure a temperature of the first substrate that comprises the at least one sensor or bridge circuit 1640. The processor 1626 may be further configured for taking into account the measured temperature, e.g. by adjusting the threshold voltage as a function of temperature, or when providing said digital value Dout in step c) of the methods of FIG. 10 to FIG. 14, or when converting this digital value into another physical quantity (e.g. a current, a torque, a position).

The circuit 1620 of FIG. 16 also illustrates that the digital processor 1626 may have a clock input and may have an internal timer or an internal counter.

Possible variations described for FIG. 15 are also applicable here.

FIG. 17 shows an illustrative example of an integrated sensor device 1730 capable of determining a digital value Dout for a physical quantity to be measured, and of detecting an error. The integrated sensor device 1730 comprises at least one sensor or bridge circuit 1740, and a circuit 1720 configured for providing a first digital value Dout1 in a manner as described above. But the sensor device 1730 further comprises an analog-to-digital convertor ADC 1731, e.g. a classical ADC, configured for digitizing one or both of the output signals, e.g. output voltages Vp, Vn and/or for digitizing a differential voltage Vdiff formed by both readout nodes RO1, RO2, and for providing a second digital value Dout2.

In an embodiment, the sensor device 1730 is further configured for detecting an error related to the formation of the first digital value Dout1, e.g. by detecting that the first and/or second event does not occur without the envisioned time span.

In an embodiment, the sensor device 1730 is further configured for performing a consistency test of the first and second digital value Dout1, Dout2, and to provide at least one of the first and second digital value or a digital value derived therefrom and an error signal.

In an embodiment, the sensor device 1730 is further configured for providing the first and the second digital value Dout1, Dout2, e.g. as output signals to an external controller (not shown), for allowing the external controller to perform a consistency test.

Such integrated sensor device 1730 is better suited for applications requiring functional safety, e.g. for use in automotive or robotic applications, because of its error detection capabilities.

It is noted that the integrated sensor device shown in FIG. 17 has a first processor 1726*a* as part of the sensing and digitization circuit 1720, and another processor 1726*b* which may be configured for outputting both digital values, and/or for testing a consistency between the two digital values Dout1 and Dout2, but two separate processors are not absolutely required, and the functionality of both processors 1726*a*, 1726*b* may be combined/implemented in a single processor. A variant of the sensor device 1730 having a single digital processor is contemplated, but not explicitly shown.

In a variant of FIG. 17, the ADC circuit 1731 is replaced by a second sensing and digitization circuit, identical to the circuit 1720, and using the same biasing signal and threshold signal(s).

In another variant of FIG. 17, the ADC circuit 1731 is replaced by a second sensing and digitization circuit, similar to the circuit 1720, but different, e.g. using a different biasing signal and/or threshold signal(s), and/or using a polynomial instead of a lookup-table, and/or using a lower clock-frequency, and/or using a smaller look-up table (with less entries, resulting in a lower resolution, but occupying less memory space), etc.

FIG. 18 shows an illustrative example of a sensing and digitization scheme having two digitization portions. This timing scheme may be used by the method of FIG. 14 and/or by the circuit of FIG. 17. In the example shown, a first digital value Dout1 is determined during a first portion wherein a time-varying biasing signal is applied to the at least one sensor or bridge circuit, as described above, using a timer or a counter; and a second digital value Dout2 is determined during a second portion wherein a constant biasing signal is applied to the at least one sensor or bridge circuit, and wherein one or both of the output signals, e.g. output voltages Vp, Vn and/or a differential voltage Vdiff between the readout nodes is digitized using an analog-to-digital convertor circuit (e.g. a classical ADC).

The invention claimed is:

1. A method of providing a digital value indicative of a physical quantity to be measured by a sensor circuit or a bridge circuit that has two excitation nodes and at least one output node, the method comprising the steps of:

a) applying a time-varying biasing signal with a predefined or a configurable waveform to the excitation nodes, causing the at least one output node to provide at least one time-varying output signal;

b) using at least one threshold signal having a predefined value or a configurable value or a predefined or a configurable waveform;

c) determining at least one time value or at least one count value or at least one index value related to a first event at which the at least one output signal passes the at least one threshold signal;

d) determining a digital value indicative of the physical quantity to be measured based on said at least one time value or count value or index value;

wherein the sensor circuit or the bridge circuit is or comprises at least one Hall element;

wherein step a) further comprises applying the time-varying biasing signal as a single-ended biasing voltage to a first excitation node of the two excitation nodes, and connecting a second excitation node of the two excitation nodes to a reference voltage.

2. The method according to claim 1, wherein the at least one threshold signal of step b) is a single threshold signal;

wherein the at least one time value or the at least one count value or the at least one index value of step c) is a single time value or a single count value or a single index value related to said first event; and wherein step d) comprises: determining said digital value based on said single time value or said single count value or said single index value.

3. The method according to claim 1, wherein the sensor circuit or the bridge circuit has two output nodes;

wherein step a) causes the two output nodes to provide a first time-varying output signal and a second time-varying output signal;

wherein the at least one threshold signal of step b) comprises: a first threshold signal having a first predefined or a first configurable value or a first predefined waveform, and a second threshold signal equal to, or different from the first threshold signal, having a second predefined value or a second configurable value or a second predefined waveform; and wherein the method further comprises step e) of generating a time-varying common-mode signal; and wherein step c) comprises: determining said at least one time value or said at least one count value or said at least one index value as a first time value or a first count value or a first index value related to said first event at which the first output signal passes the first threshold signal; and as a second time value or a second count value or a second index value related to a second event at which the common-mode signal passes the second threshold signal; and wherein step d) comprises: determining said digital value based on said first and second time value or based on said first and second count value or based on said first and second index value, or based on a difference between the first and second time value, or based on a difference between said first and second count value, or based on a difference between said first and said second index value.

4. The method according to claim 1, wherein the at least one threshold signal of step b) comprises: a first threshold signal having a first predefined or a first configurable value or a first predefined waveform, and a second threshold signal equal to, or different from the first threshold signal, having a second predefined value or a second configurable value or a second predefined waveform;

wherein step c) comprises: determining said at least one time value or said at least one count value or said at least one index value as a first time value or a first count value or a first index value related to said first event at which the first output signal passes the first threshold signal; and wherein the method further comprises: using a predefined second time value or a predefined second count value or a second index value; and wherein step d) comprises: determining said digital value based on said first and second time value or based on said first and second count value or based on said first and second index value, or based on a difference between the first and second time value, or based on a difference between said first and second count value, or based on a difference between said first and said second index value.

5. The method according to claim 1, wherein the at least one threshold signal or threshold value has a predefined voltage level or a predefined value; or wherein the at least one threshold signal has a configurable voltage level or a configurable value.

6. The method according to claim 1, wherein the sensor circuit or the bridge circuit has two output nodes;

wherein the at least one threshold signal of step b) comprises: a first threshold signal having a first predefined or a first configurable value or a first predefined waveform, and a second threshold signal equal to, or different from the first threshold signal, having a second predefined value or a second configurable value or a second predefined waveform;

wherein step a) causes the two output nodes to provide a first time-varying output signal and a second time-varying output signal;

wherein step c) comprises: determining said at least one time value or said at least one count value or said at least one index value as a first time value or a first count value or a first index value related to said first event at which the first output-signal passes the first threshold signal; and as a second time value or a second count value or a second index value related to a second event at which the second output-signal passes the second threshold signal; and wherein step d) comprises: determining said digital value based on said first and second time value or based on said first and second count value or based on said first and second index value, or based on a difference between the first and second time value, or based on a difference between said first and second count value, or based on a difference between said first and said second index value.

7. The method according to claim 6, wherein the method further comprises: determining a first threshold value and a second threshold value, and applying these values to at least one digital-to-analog convertor to generate the first and second threshold signal, and dynamically adjusting these values in a control loop such that the first event substantially coincides with the second event, or such that a difference between the first and the second time value or such that a difference between the first and the second count value is substantially equal to a predefined value; and wherein step d) comprises: considering the first and the second threshold value as a first and second index value, and determining said digital value based on said first and second or based on a difference between the first and second index.

8. The method according to claim 1, wherein the biasing signal of step a) has a waveform with a linearly increasing or a linearly decreasing portion; or wherein the biasing signal of step a) has a waveform with an exponential portion; or wherein the biasing signal of step a) has a sinusoidal waveform.

9. The method according to claim 1, further comprising a step of: measuring a temperature; and wherein the method further comprises: adjusting the at least one threshold voltage based on the measured temperature; or wherein the method further comprises: adjusting the at least one measured time value or adjusting the at least one measured count value or adjusting the at least one measured index value or adjusting the difference between the first and the second time value, or adjusting the difference between the first and the second count value, or adjusting the difference between the first and the second index value, based on the measured temperature.

10. A circuit for providing a digital value indicative of a physical quantity to be measured by a sensor circuit or a bridge circuit that has two excitation nodes and at least one readout node, the circuit comprising:

a biasing circuit;

a threshold generator for generating the at least one threshold signal or value;

at least one of the following: a timer, a counter, a lookup-table with a DAC;

comparison means for comparing the at least one output signal or a signal or value derived therefrom and the at least one threshold signal or value;

a controller configured for performing a method according to claim 1.

11. An integrated sensor device comprising:

at least one sensor circuit or bridge circuit that has two excitation nodes and at least one readout node;

at least one circuit according to claim 10, operatively connected to the excitation nodes and to the at least one output node of said at least one sensor circuit or bridge circuit.

12. The integrated sensor device according to claim 11, wherein the circuit is configured for providing a first digital value; and wherein the integrated sensor device further comprises an analog-to-digital convertor configured for digitizing one or both of the readout voltages or for digitizing a differential voltage formed by both readout nodes, and for providing a second digital value;

the sensor device being further configured for providing the first and the second digital value for allowing an external controller to perform a consistency test, or being further configured for performing a consistency test of the first and second digital value, and to provide at least one of the first and second digital value or a digital value derived therefrom and an error signal.

13. The integrated sensor device according to claim 11, comprising a plurality of at least two sensor or bridge circuits.

14. The integrated sensor device according to claim 13, further comprising one or two comparators for each sensor or bridge circuit;

wherein an output of each comparator is connected to a respective input of the controller.

* * * * *